(12) United States Patent  
Park

(10) Patent No.: US 9,852,993 B2  
(45) Date of Patent: Dec. 26, 2017

(54) LATERAL HIGH VOLTAGE INTEGRATED DEVICES HAVING TRENCH INSULATION FIELD PLATES AND METAL FIELD PLATES

(71) Applicant: SK hynix Inc., Gyeonggi-do (KR)

(72) Inventor: Sung Kun Park, Chungcheongbuk-do (KR)

(73) Assignee: SK HYNIX SYSTEM IC INC., Chungcheongbuk-Do (KR)

(*) Notice: Subject to any disclaimer, the term of this patent is extended or adjusted under 35 U.S.C. 154(b) by 0 days.

(21) Appl. No.: 15/017,308

(22) Filed: Feb. 5, 2016

(65) Prior Publication Data

US 2017/0104097 A1 Apr. 13, 2017

(30) Foreign Application Priority Data

Oct. 7, 2015 (KR) .................. 10-2015-0140942

(51) Int. Cl.

| H01L 29/78 | (2006.01) |
|---|---|
| H01L 23/535 | (2006.01) |
| H01L 29/40 | (2006.01) |
| H01L 29/08 | (2006.01) |
| H01L 29/10 | (2006.01) |
| H01L 29/06 | (2006.01) |

(52) U.S. Cl.
CPC ........ *H01L 23/535* (2013.01); *H01L 29/0653* (2013.01); *H01L 29/404* (2013.01); *H01L 29/407* (2013.01); *H01L 29/7835* (2013.01); *H01L 29/0869* (2013.01); *H01L 29/1045* (2013.01)

(58) Field of Classification Search
CPC ..... H01L 29/7869; H01L 21/16; H01L 21/00; H01L 29/24; H01L 21/479; H01L 29/0653; H01L 29/404; H01L 29/407; H01L 29/7835; H01L 29/0869
See application file for complete search history.

(56) References Cited

U.S. PATENT DOCUMENTS

| 8,664,714 B2 | 3/2014 | Liu | |
|---|---|---|---|
| 2010/0237412 A1* | 9/2010 | Shrivastava | ........ H01L 29/0653 257/336 |
| 2013/0187226 A1* | 7/2013 | Park | ...................... H01L 29/402 257/343 |

(Continued)

FOREIGN PATENT DOCUMENTS

KR 1020060009487 2/2006

*Primary Examiner* — Marcos D Pizarro  
*Assistant Examiner* — Long H Le

(57) ABSTRACT

A high voltage integrated device includes a source region and a drain region disposed in a semiconductor layer and spaced apart from each other, a drift region disposed in the semiconductor layer and surrounding the drain region, a channel region defined in the semiconductor layer and between the source region and the drift region, a trench insulation field plate disposed in the drift region, a recessed region provided in the trench isolation field plate, a metal field plate disposed over the trench insulation field plate, and filling the recessed region, a gate insulation layer provided over the channel region and extending over the drift region and over the trench insulation field plate, and a gate electrode disposed over the gate insulation layer.

21 Claims, 18 Drawing Sheets

(56) References Cited

U.S. PATENT DOCUMENTS

| | | | | |
|---|---|---|---|---|
| 2013/0234259 A1* | 9/2013 | Yang | ............... | H01L 21/76814 257/401 |
| 2013/0341714 A1* | 12/2013 | Jang | ............... | H01L 29/7816 257/335 |
| 2015/0294984 A1* | 10/2015 | Cheng | ............... | H01L 27/1203 257/347 |
| 2017/0033191 A1* | 2/2017 | Meiser | ............. | H01L 21/31155 |

* cited by examiner

LATERAL HIGH VOLTAGE INTEGRATED DEVICES HAVING TRENCH INSULATION FIELD PLATES AND METAL FIELD PLATES

CROSS-REFERENCE TO RELATED APPLICATION

The present application claims priority under 35 U.S.C 119(a) to Korean Patent Application No. 10-2015-0140942, filed on Oct. 7, 2015, which is herein incorporated by reference in its entirety.

BACKGROUND

1. Technical Field

Various embodiments of the present disclosure relate to lateral high voltage integrated devices and, more particularly, to lateral high voltage integrated devices having trench insulation field plates and metal field plates.

2. Related Art

Integrated devices having functions of both a controller and a driver are referred to as smart power devices. In general, output circuits of the smart power devices may be designed to include high voltage integrated devices such as lateral double diffused MOS (LDMOS) transistors operating at high voltages. In the high voltage integrated devices breakdown voltages of the LDMOS transistors, for example a drain junction breakdown voltage and a gate dielectric breakdown voltage are important factors that directly influence the stable operation of the LDMOS transistors. In addition, an on-resistance (Ron) value of the LDMOS transistors is also an important factor that influences electrical characteristics of the LDMOS transistors, for example, a current drivability of the LDMOS transistors. To improve the drain junction breakdown voltage of the LDMOS transistors, a doping concentration of a drift region between a drain region and a channel region has to be reduced or a drift length of carriers in the drift region corresponding to a length of a current path in the drift region has to be increased. However, in such a case, the current drivability of the LDMOS transistors may be degraded and the on-resistance (Ron) of the LDMOS transistors increases. On the contrary, if the doping concentration of the drift region between the drain region and the channel region increases or the drift length in the drift region decreases, the on-resistance (Ron) of the LDMOS transistors may be reduced and the current drivability of the LDMOS transistors improves. However, the drain junction breakdown voltages of the LDMOS transistors may be lowered. That is, in the LDMOS transistors, the on-resistance and the drain junction breakdown voltage may have a trade-off relationship.

SUMMARY

Various embodiments are directed to lateral high voltage integrated devices having trench insulation field plates and metal field plates.

According to an embodiment a high voltage integrated device includes a source region and a drain region disposed in a semiconductor layer and spaced apart from each other, a drift region disposed in the semiconductor layer and surrounding the drain region, a channel region defined in the semiconductor layer and between the source region and the drift region, a trench insulation field plate disposed in the drift region, a recessed region provided in the trench isolation field plate, a metal field plate disposed over the trench insulation field plate, and filling the recessed region, a gate insulation layer provided over the channel region and extending over the drift region and over the trench insulation field plate, and a gate electrode disposed over the gate insulation layer.

According to another embodiment, a high voltage integrated device includes a source region and a drain region disposed in a semiconductor layer and spaced apart from each other, a drift region disposed in the semiconductor layer and surrounding the drain region, a channel region defined in the semiconductor layer between the source region and the drift region, a trench insulation field plate disposed in the drift region a recessed region provided in the trench insulation field plate, a metal field plate disposed over the trench insulation field plate and filling the recessed region, a first gate stack provided over the channel region and extending to over the drift region and over the trench insulation field plate, wherein the first gate stack includes a first gate insulation layer and a first gate electrode which are stacked, a first source-side gate spacer and a first drain-side gate spacer disposed over first and second sidewalls of the first gate stack, respectively, a second gate stack disposed over the trench insulation field plate, wherein the second gate stack includes a second gate insulation layer and a second gate electrode which are stacked, and a second source-side gate spacer and a second drain-side gate spacer disposed on first and second sidewalls of the second gate stack, respectively.

According to another embodiment, a high voltage integrated device includes a source region and a drain region disposed in a semiconductor layer and spaced apart from each other, a drift region disposed in the semiconductor layer and surrounding the drain region, a channel region formed in the semiconductor layer and between the source region and the drift region, a trench insulation field plate disposed in the drift region, a plurality of recessed regions formed in the trench insulation field plate, wherein the plurality of recessed regions are spaced apart from each other and arranged in a channel length direction, a plurality of metal field plates disposed over the trench insulation field plate and filling the plurality of recessed regions, respectively, a gate insulation layer formed over the channel region and extending to over the drift region and over the trench insulation field plate, and a gate electrode disposed over the gate insulation layer.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on," "over," "above," "under," "beneath," "below," "side," or "aside" another element, it may directly contact the other element, or at least one intervening element may be present therebetween. Accordingly, the terms such as "on," "over" "above," "under," "beneath," "below," "side," "aside," and the like that are used herein are for the purpose of describing only a position relationship of two elements and are not intended to limit the scope of the present disclosure.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
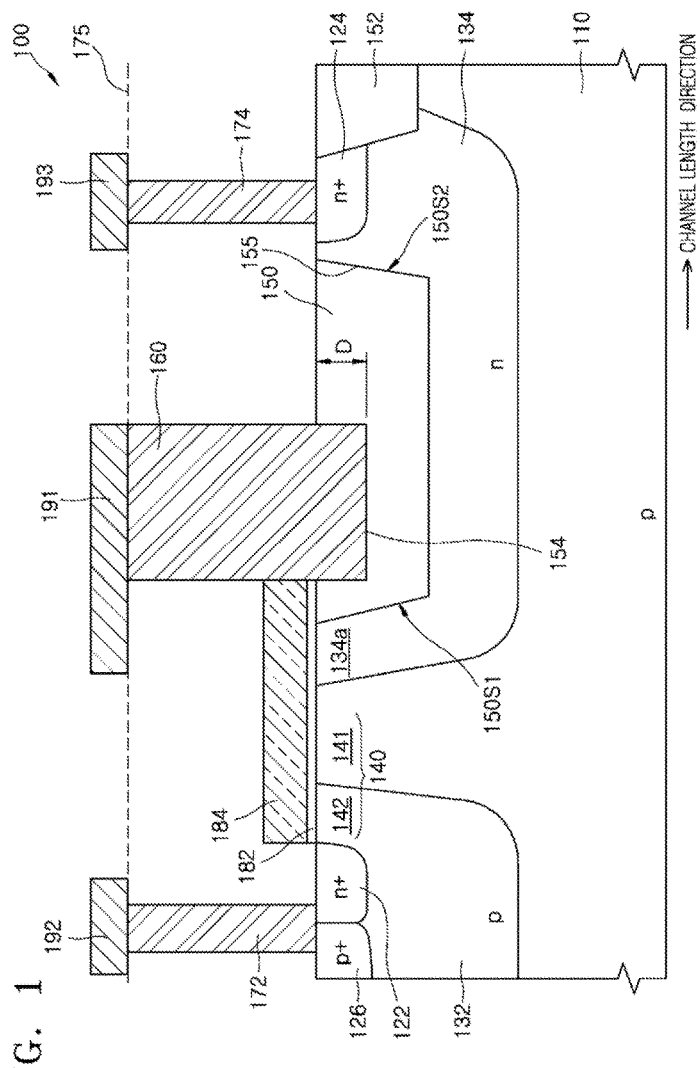
FIG. 1 is a cross-sectional view illustrating a high voltage integrated device having a trench insulation field plate and a single metal field plate according to an embodiment.

FIG. 1 is a cross-sectional view illustrating a high voltage integrated device 100 having a trench insulation field plate and a single metal field plate according to an embodiment. Referring to FIG. 1, the high voltage integrated device 100 may include an N-type source region 122 and an N-type drain region 124 which are disposed in a semiconductor layer 110. The semiconductor layer 110 may be a semiconductor substrate having P-type conductivity. The semiconductor layer 110 may be a semiconductor-on-insulator (SOI) substrate. In such a case, a semiconductor layer disposed on an insulator may have P-type conductivity. The semiconductor layer 110 may be an epitaxial layer having P-type conductivity.

Although not shown in the drawings, the semiconductor layer 110 may be disposed on a substrate. In such a case, an N-type buried layer heavily doped with N-type impurities may be disposed between the semiconductor layer 110 and the substrate. The N-type source region 122 may be surrounded by a P-type body region 132 disposed in the semiconductor layer 110. A P-type contact region 126 may be disposed in an upper portion of the P-type body region 132. A sidewall of the P-type contact region 126 may be in direct contact with a sidewall of the N-type source region 122. The N-type drain region 124 may be surrounded by an N-type drift region 134 disposed in the semiconductor layer 110.

A channel region 140 may be defined between the N-type source region 122 and the N-type drift region 134. The channel region 140 may include a first channel region 141 and a second channel region 142. The first channel region 141 may correspond to an upper portion of the semiconductor layer 110 between the P-type body region 132 and the N-type drift region 134. The second channel region 142 may correspond to an upper portion of the P-type body region 132 between the N-type source region 122 and the first channel region 141.

A trench insulation field plate 150 may be disposed in an upper portion of the N-type drift region 134 between the channel region 140 and the N-type drain region 124. The trench insulation field plate 150 may include the same material as a shallow trench isolation layer 152 disposed in the semiconductor layer 110 to separate a plurality of integrated devices from each other. The trench insulation field plate 150 and the shallow trench isolation layer 152 may be simultaneously formed. Accordingly, a top surface of the trench insulation field plate 150 may be coplanar with a top surface of the shallow trench isolation layer 152.

The trench insulation field plate 150 may have a thickness of about 3000 angstroms. A junction depth of the N-type drift region 134 may be greater than a thickness of the trench insulation field plate 150. Thus, a bottom surface of the trench insulation field plate 150 may be spaced apart from a bottom surface of the N-type drift region 134 by a certain distance. That is, a bottom surface of the trench insulation field plate 150 may be covered with the N-type drift region 134.

The trench insulation field plate 150 may correspond to an insulation layer, for example, an oxide layer filling a trench 155 that is provided in the N-type drift region 134 to have a certain depth from a top surface of the N-type drift region 134. The trench insulation field plate 150 may have a first sidewall 150S1 adjacent to the first channel region 141 and a second sidewall 150S2 adjacent to the N-type drain region 124. That is, the first sidewall 150S1 and the second sidewall 150S2 may be arranged between the first channel region 141 and the N-type drain region 124 in a channel length direction.

The first and second sidewalls 150S1 and 150S2 of the trench insulation field plate 150 may have a sloped profile. Alternatively, the first and second sidewalls 150S1 and 150S2 of the trench insulation field plate 150 may have a vertical profile. The first sidewall 150S1 of the trench insulation field plate 150 may be located close to a sidewall of the N-type drift region 134 adjacent to the first channel region 141. The second sidewall 150S2 of the trench insulation field plate 150 may be located close to the N-type drain region 124. Although not shown in the drawings, in some embodiments, the second sidewall 150S2 of the trench insulation field plate 150 may contact the N-type drain region 124. The trench insulation field plate 150 may have a recessed region 154. The recessed region 154 may have a certain depth D when measured from a top surface of the trench insulation field plate 150.

A metal field plate 160 may be disposed on the trench insulation field plate 150. The metal field plate 160 may fill the recessed region 154 and may extend upwardly to a higher level than the top surface of the trench insulation field plate 150 by a certain height. That is a lower portion of the metal field plate 160 may be inserted into the recessed region 154. In some embodiments, the metal field plate 160 may include a tungsten material.

A gate insulation layer 182 and a gate electrode 184 may be sequentially stacked on the channel region 140. In some embodiments, the gate insulation layer 182 may include an oxide material and the gate electrode 184 may include a polysilicon material. The gate insulation layer 182 and the gate electrode 184 may extend onto the N-type drift region 134 and the trench insulation field plate 150 along the channel length direction. Extensions of the gate insulation layer 182 and the gate electrode 184 may be in direct contact with a sidewall of the metal field plate 160. Thus, the gate electrode 184 may be electrically and physically connected to the metal field plate 160. A thickness of the gate electrode 184 may be less than a height of a protrusion of the metal field plate 160 that protrudes higher than the top surface of the trench insulation field plate 150.

A source contact plug 172 may be disposed on the N-type source region 122 and the P-type contact region 126. A drain contact plug 174 may be disposed on the N-type drain region 124. Each of the source contact plug 172 and the drain contact plug 174 may include the same metal material as the metal field plate 160. Top surfaces of the source contact plug 172, the drain contact plug 174 and the metal field plate 160 may be coplanar with each other and may be located at substantially the same level which is indicated by a dotted line 175 in FIG. 1.

A first metal interconnection line 191 may be disposed on a top surface of the metal field plate 160. A second metal interconnection line 192 may be disposed on a top surface of the source contact plug 172. A third metal interconnection line 193 may be disposed on a top surface of the drain contact plug 174.

A turn-on voltage or a turn-off voltage may be applied to the metal field plate 160 and the gate electrode 184 through the first metal interconnection line 191. A ground voltage VSS may be applied to the N-type source region 122 and the P-type body region 132 through the second metal interconnection line 192. A drain voltage VDD may be applied to the N-type drain region 124 through the third metal interconnection line 193.

When the turn-on voltage is applied to the gate electrode 184 through the first metal interconnection line 191 and the metal field plate 160 while the ground voltage VSS is applied to the N-type source region 122 and the drain voltage VDD is applied to the N-type drain region 124, the high voltage integrated device 100 may be turned on. Under the above bias condition, a channel inversion layer having N-type conductivity may be formed in the first and second channel regions 141 and 142 to turn on the high voltage integrated device 100. When the high voltage integrated device 100 is turned on, carriers such as electrons in the N-type source region 122 may be drifted into the N-type drift region 134 through the inversion channel layer by a horizontal electric field which is created by the drain voltage VDD applied to the N-type drain region 124. Subsequently, the electrons in the N-type drift region 134 may also be drifted into the N-type drain region 124 along the sidewalls 150S1 and 150S2 and the bottom surface of the trench insulation field plate 150.

While the P-type body region 132 and the semiconductor layer 110 are grounded and the drain voltage VDD is applied to the N-type drain region 124, a depletion region may be formed in the N-type drift region 134. In such a case, a depletion width in an upper portion of the N-type drift region 134 may increase due to the presence of the trench insulation field plate 150. Accordingly, a junction breakdown voltage of the N-type drift region 134 and the N-type drain region 124 may be improved at the surface of the high voltage integrated device 100.

In addition, a drift length of carriers in the N-type drift region 134 may increase due to the presence of the trench insulation field plate 150. Thus a peak electric field at an edge of the first channel region 141 contacting the N-type drift region 134 may be reduced and a drain junction breakdown voltage characteristic of the high voltage integrated device 100 improves.

Even though a drift length of the carriers in the N-type drift region 134 increases due to the presence of the trench insulation field plate 150, the turn-on voltage applied to the metal field plate 160 may induce additional carrier accumulation such as, electrons in the N-type drift region 134 to compensate for degradation of an on-resistance characteristic of the high voltage integrated device 100. Specifically, when the turn-on voltage is applied to both of the metal field plate 160 and the gate electrode 184, the turn-on voltage applied to the metal field plate 160 may induce the additional electron accumulation in an accumulation region 134a corresponding to an upper portion of the N-type drift region 134 adjacent to the first channel region 141 in addition to an original electron accumulation induced by the turn-on voltage applied to the gate electrode 184. Thus, an amount of carriers such as electrons drifted in the N-type drift region 134 may increase to improve a current drivability of the high voltage integrated device 100.

Figure 2:
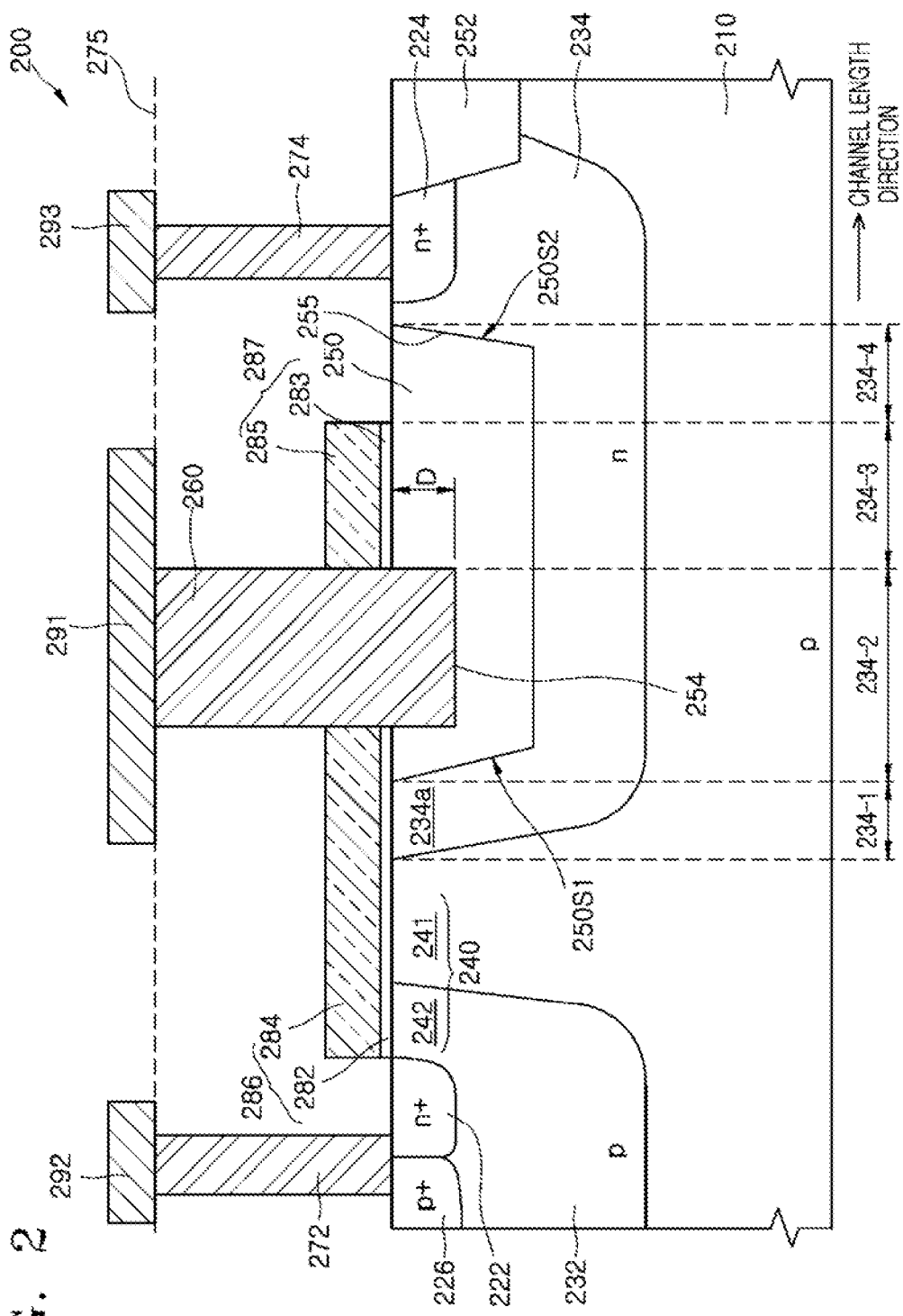
FIG. 2 is a cross-sectional view illustrating a high voltage integrated device having a trench insulation field plate, a single metal field plate, and a conductive field plate according to an embodiment.

FIG. 2 is a cross-sectional view illustrating a high voltage integrated device 200 having a trench insulation field plate, a single metal field plate and a conductive field plate according to an embodiment. Referring to FIG. 2, the high voltage integrated device 200 may include an N-type source region 222 and an N-type drain region 224 which are disposed in a semiconductor layer 210. The semiconductor layer 210 may be a semiconductor substrate having P-type conductivity. The semiconductor layer 210 may be an SOI substrate. In such a case, a semiconductor layer disposed on an insulator may have P-type conductivity. The semiconductor layer 210 may be an epitaxial layer having P-type conductivity. Although not shown in the drawings, the semiconductor layer 210 may be disposed on a substrate. In such a case, an N-type buried layer heavily doped with N-type impurities may be disposed between the semiconductor layer 210 and the substrate.

The N-type source region 222 may be surrounded by a P-type body region 232 disposed in the semiconductor layer 210. A P-type contact region 226 may be disposed in an upper portion of the P-type body region 232. A sidewall of the P-type contact region 226 may be in direct contact with a sidewall of the N-type source region 222. The N-type drain region 224 may be surrounded by an N-type drift region 234 disposed in the semiconductor layer 210. A channel region 240 may be defined between the N-type source region 222 and the N-type drift region 234.

The channel region 240 may include a first channel region 241 and a second channel region 242. The first channel region 241 may correspond to an upper portion of the semiconductor layer 210 between the P-type body region 232 and the N-type drift region 234. The second channel region 242 may correspond to an upper portion of the P-type body region 232 between the N-type source region 222 and the first channel region 241.

A trench insulation field plate 250 may be disposed in an upper portion of the N-type drift region 234 between the channel region 240 and the N-type drain region 224. The trench insulation field plate 250 may include the same material as a shallow trench isolation layer 252 disposed in the semiconductor layer 210. The shallow trench isolation layer 252 separates a plurality of integrated devices from each other. The trench insulation field plate 250 and the shallow trench isolation layer 252 may be simultaneously formed. Accordingly, a top surface of the trench insulation field plate 250 may be coplanar with a top surface of the shallow trench isolation layer 252.

The trench insulation field plate 250 may have a thickness of about 3000 angstroms. A junction depth of the N-type drift region 234 may be greater than a thickness of the trench insulation field plate 250. Thus, a bottom surface of the trench insulation field plate 250 may be spaced apart from a bottom surface of the N-type drift region 234 by a certain distance. That is, a bottom surface of the trench insulation field plate 250 may be covered with the N-type drift region 234. The trench insulation field plate 250 may correspond to an insulation layer, for example, an oxide layer filling a trench 255 that is provided in the N-type drift region 234 and extends to a certain depth from a top surface of the N-type drift region 234.

The trench insulation field plate 250 may have a first sidewall 250S1 adjacent to the first channel region 241 and a second sidewall 250S2 adjacent to the N-type drain region 224. That is, the first sidewall 250S1 and the second sidewall 250S2 may be sequentially disposed from the first channel region 241 toward the N-type drain region 224 in a channel length direction. Either or both of the first and second sidewalls 250S1 and 250S2 of the trench insulation field plate 250 may have a sloped profile. Alternatively, either or both of the first and second sidewalls 250S1 and 250S2 of the trench insulation field plate 250 may have a vertical profile.

The first sidewall 250S1 of the trench insulation field plate 250 may be disposed spaced apart from a sidewall of the N-type drift region 234 adjacent to the first channel region 241. The second sidewall 250S2 of the trench insulation field plate 250 may be spaced apart from the N-type drain region 224. Although not shown in the drawings, in some embodiments, the second sidewall 250S2 of the trench insulation field plate 250 may contact the N-type drain region 224. The trench insulation field plate 250 may have a recessed region 254. The recessed region 254 may have a certain depth D when measured from a top surface of the trench insulation field plate 250.

A metal field plate 260 may be disposed on the trench insulation field plate 250. The metal field plate 260 may fill the recessed region 254 and may extend upwardly to protrude higher than the top surface of the trench insulation field plate 250 by a certain height. That is, a lower portion of the metal field plate 260 may be inserted into the recessed region 254.

In some embodiments, the metal field plate 260 may include a tungsten material. A first gate insulation layer 282 and a first gate electrode 284 may be sequentially stacked on the channel region 240 to constitute a gate stack 286. In some embodiments, the first gate insulation layer 282 may include an oxide material and the first gate electrode 284 may include a polysilicon material.

The gate stack 286 may extend onto the N-type drift region 234 and the trench insulation field plate 250 along the channel length directions. An extension of the gate stack 286 may be in direct contact with a first sidewall of the metal field plate 260. A thickness of the first gate electrode 284 may be less than a height of a protrusion of the metal field plate 260 that protrudes higher than the top surface of the trench insulation field plate 250.

A conductive field plate 287 may be disposed on the trench insulation field plate 250 and be adjacent to a second sidewall of the metal field plate 260 opposite to the gate stack 286. The conductive field plate 287 may include a second gate insulation layer 283 and a second gate electrode 285 which are sequentially stacked. A thickness of the second gate electrode 285 may be substantially equal to a thickness of the first gate electrode 284.

The conductive field plate 287 may be disposed on a top surface of the trench insulation field plate 250 between the metal field plate 260 and the N-type drain region 224. A sidewall of the conductive field plate 287 may be in contact with the second sidewall of the metal field plate 260. Thus, the first and second sidewalls of the metal field plate 260 may contact a sidewall of the gate stack 286 and a sidewall of the conductive field plate 287, respectively. Accordingly, the first gate electrode 284 and the second gate electrode 285 may be electrically and physically connected to the metal field plate 260. A top surface of the trench insulation field plate 250 between the conductive field plate 287 and the N-type drain region 224 may be exposed.

A source contact plug 272 may be disposed on the N-type source region 222 and the P-type contact region 226. A drain contact plug 274 may be disposed on the N-type drain region 224. Each of the source contact plug 272 and the drain contact plug 274 may include the same metal material as the metal field plate 260. Top surfaces of the source contact plug 272, the drain contact plug 274, and the metal field plate 260 may be coplanar with each other and may be located at substantially the same level which is indicated by a dotted line 275 in FIG. 2.

A first metal interconnection line 291 may be disposed on a top surface of the metal field plate 260. A second metal interconnection line 292 may be disposed on a top surface of the source contact plug 272. A third metal interconnection line 293 may be disposed on a top surface of the drain contact plug 274.

A turn-on voltage or a turn-off voltage may be applied to the first gate electrode 284 through the first metal interconnection line 291. The turn-on voltage or the turn-off voltage may also be applied to the metal field plate 260 and the second gate electrode 285 through the first metal interconnection line 291. A ground voltage VSS may be applied to the N-type source region 222 and the P-type body region 232 through the second metal interconnection line 292. A drain voltage VDD may be applied to the N-type drain region 224 through the third metal interconnection line 293.

In the high voltage integrated device 200, the N-type drift region 234 may include various distinct regions along the channel length direction. For example, the N-type drift region 234 may be divided into first to fourth N-type drift regions 234-1, 234-2, 234-3 and 234-4 along the channel length direction.

The first N-type drift region 234-1 may be a region including an accumulation region 234a located between the first channel region 241 and the trench insulation field plate 250. Accordingly, the first N-type drift region 234-1 does not include the trench insulation field plate 250 and the metal field plate 260. The trench insulation field plate 250 may be disposed in the second, third and fourth N-type drift regions 234-2, 234-3 and 234-4. The metal field plate 260 may be disposed in the second N-type drift region 234-2. Since the metal field plate 260 is inserted into the trench insulation field plate 250 to a predetermined depth, a thickness of the trench insulation field plate 250 under the metal field plate 260 may be reduced by the predetermined depth of the metal field plate 260.

The conductive field plate 287 may be disposed on the trench insulation field plate 250 in the third N-type drift region 234-3. Since the conductive field plate 287 is disposed on a top surface of the trench insulation field plate 250, a thickness of the trench insulation field plate 250 in the third N-type drift region 234-3 may be greater than a thickness of the trench insulation field plate 250 in the second N-type drift region 234-2. The metal field plate 260 and the conductive field plate 287 are not disposed in the fourth N-type drift region 234-4.

A drift length of carriers in the N-type drift region 234 may increase due to the presence of the trench insulation field plate 250. Thus, a peak electric field at an edge of the first channel region 241 contacting the N-type drift region 234 may be reduced and a drain junction breakdown voltage characteristic of the high voltage integrated device 200 improves.

Even though a drift length of the carriers in the N-type drift region 234 increases due to the presence of the trench insulation field plate 250, the turn-on voltage applied to the metal field plate 260 may induce additional carrier accumulation that is, electrons in the N-type drift region 234 to compensate for degradation of an on-resistance characteristic of the high voltage integrated device 200. Specifically, when the turn-on voltage is applied to both of the metal field plate 260 and the first gate electrode 284, the turn-on voltage applied to the metal field plate 260 may induce the additional electron accumulation in the accumulation region 234a corresponding to an upper portion of the N-type drift region 234 adjacent to the first channel region 241 in addition to original electron accumulation induced by the turn-on voltage applied to the first gate electrode 284. Thus, an amount of carriers such as electrons drifted in the N-type drift region 234 may increase to improve a current drivability of the high voltage integrated device 200.

Moreover, in the event that the conductive field plate 287 is disposed on the trench insulation field plate 250 between the metal field plate 260 and the N-type drain region 224, a junction breakdown voltage of the N-type drift region 234 may be further improved. Specifically, when the second gate electrode 285 and the semiconductor layer 210 are grounded and a positive drain voltage VDD is applied to the N-type drain region 224, a first vertical electric field may be created across a metallurgical junction between the N-type drift region 234 and the semiconductor layer 210. The first vertical electric field may be distributed to have a direction from the N-type drift region 234 toward the semiconductor layer 210. That is, the first vertical electric field may be a downward electric field. In addition, a second vertical electric field may be created across the trench insulation field plate 250 between the second gate electrode 285 and the N-type drift region 234.

In such a case, the second vertical electric field may be distributed to have a direction from the N-type drift region 234 toward the second gate electrode 285. That is, the second vertical electric field may be an upward electric field. This is due to the second gate electrode 285 being grounded while the positive drain voltage VDD is applied to the N-type drain region 224. Thus, the second vertical electric field may be distributed to have an opposite direction to the first vertical electric field. As a result, the first vertical electric field may be reduced or offset by the second vertical electric field and thus a junction breakdown voltage of the N-type drift region 234, which is substantially the N-type drain region 224, may further improve.

In particular, when a length of the second gate electrode 285 in the channel length direction is appropriately controlled, the second gate electrode 285 may effectively reduce a peak electric field distributed in the vicinity of a lower corner of the trench insulation field plate 250. As a result, the junction breakdown voltage of the N-type drift region 234 may be further improved due to the presence of the second gate electrode 285. As such, electrical characteristics of the high voltage integrated device 200 may be controlled and improved by appropriately designing the structure of the N-type drift region 234 and the field plates 260, 287.

As described above, the N-type drift region 234 disposed between the first channel region 241 and the N-type drain region 224 may include the first to fourth N-type drift regions 234-1, 234-2, 234-3 and 234-4 which are sequentially disposed from an edge of the first channel region 241 toward the N-type drain region 224. The trench insulation field plate 250 and the metal field plate 260 are not disposed in the first N-type drift region 234-1, and the trench insulation field plate 250 and the metal field plate 260 are disposed in the second N-type drift region 234-2. The trench insulation field plate 250 may extend into the third N-type drift region 234-3, and a thickness of the trench insulation field plate 250 in the third N-type drift region 234-3 may be greater than a thickness of the trench insulation field plate 250 in the second N-type drift region 234-2.

The conductive field plate 287 may be disposed on a top surface of the trench insulation field plate 250 in the third N-type drift region 234-3. The trench insulation field plate 250 may further extend into the fourth N-type drift region 234-4, and a thickness of the trench insulation field plate 250 in the fourth N-type drift region 234-4 may be substantially equal to a thickness of the trench insulation field plate 250 in the third N-type drift region 234-3. No field plate may be disposed in and on the fourth N-type drift region 234-4.

The characteristics of the high voltage integrated device 200 may vary according to lengths of the first to fourth N-type drift regions 234-1, 234-2, 234-3 and 234-4 in the channel length direction. The lengths of the first to fourth N-type drift regions 234-1, 234-2, 234-3 and 234-4 in the channel length direction may be set by controlling lengths of the trench insulation field plate 250, the metal field plate 260 and the conductive field plate 287 which are arranged in the channel length direction.

Figure 3:
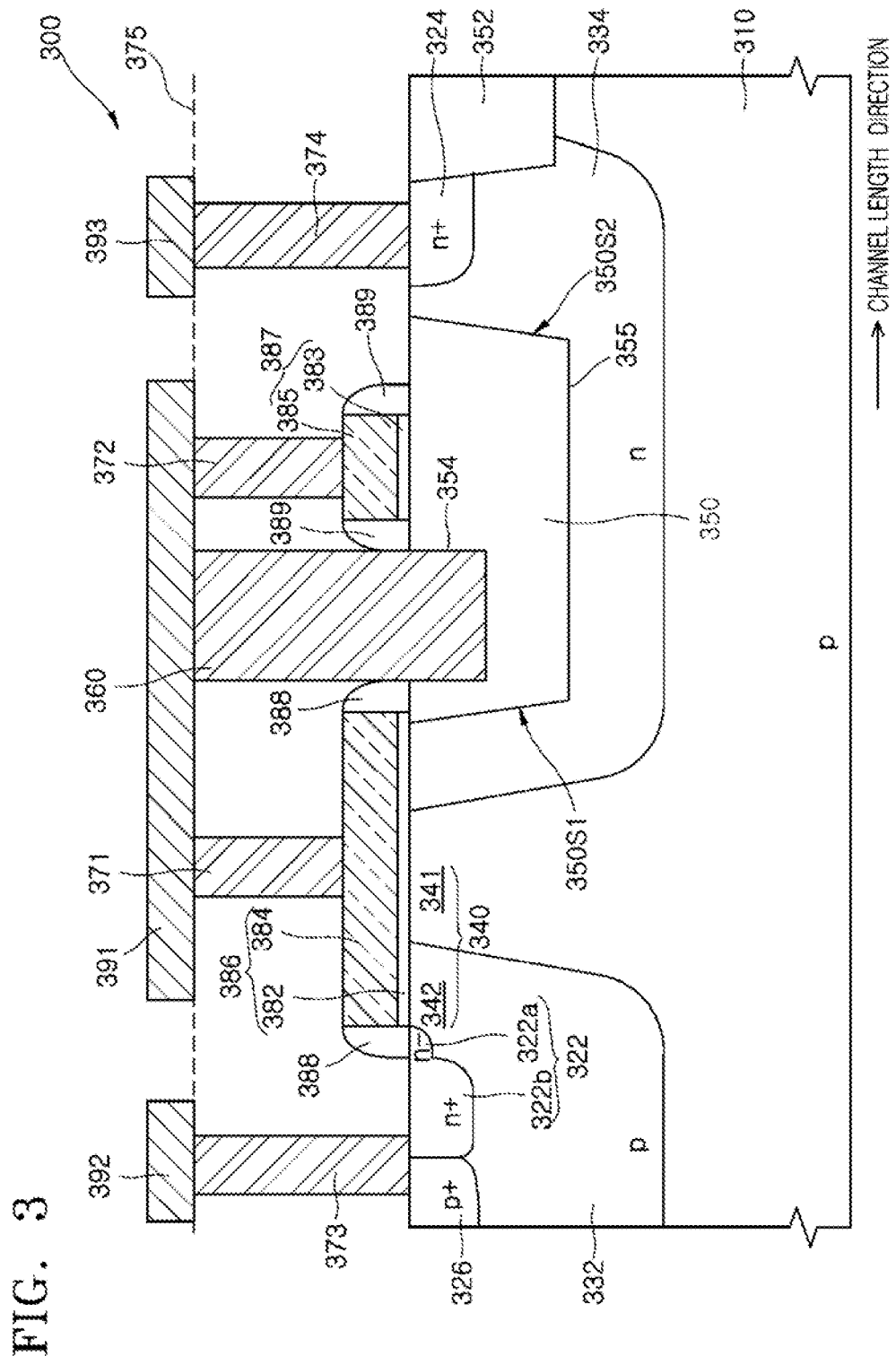
FIG. 3 is a cross-sectional view illustrating a high voltage integrated device having a trench insulation field plate, a single metal field plate, and a conductive field plate according to another embodiment.

FIG. 3 is a cross-sectional view illustrating a high voltage integrated device 300 having a trench insulation field plate, a single metal field plate and a conductive field plate according to another embodiment. Referring to FIG. 3, the high voltage integrated device 300 may include an N-type source region 322 and an N-type drain region 324 which are disposed in a semiconductor layer 310. The semiconductor layer 310 may be a semiconductor substrate having P-type conductivity. The semiconductor layer 310 may be an SOI substrate. In such a case, a semiconductor layer disposed on an insulator may have P-type conductivity. The semiconductor layer 310 may be an epitaxial layer having P-type conductivity.

Although not shown in the drawings, the semiconductor layer 310 may be disposed on a substrate. In such a case, an N-type buried layer heavily doped with N-type impurities may be disposed between the semiconductor layer 310 and the substrate.

The N-type source region 322 may be surrounded by a P-type body region 332 disposed in the semiconductor layer 310. The N-type source region 322 may have a lightly doped drain (LDD) structure which is comprised of an N-type source extension region 322a lightly doped with N-type impurities and an N-type deep source region 322b heavily doped with N-type impurities. That is, an impurity concentration of the N-type source extension region 322a may be lower than an impurity concentration of the N-type deep source region 322b.

A P-type contact region 326 may be disposed in an upper portion of the P-type body region 332. A sidewall of the P-type contact region 326 may be in direct contact with a sidewall of the N-type source region 322. The N-type drain region 324 may be surrounded by an N-type drift region 334 disposed in the semiconductor layer 310.

A channel region 340 may be defined between the N-type source region 322 and the N-type drift region 334. The channel region 340 may include a first channel region 341 and a second channel region 342. The first channel region 341 may correspond to an upper portion of the semiconductor layer 310 between the P-type body region 332 and the N-type drift region 334. The second channel region 342 may correspond to an upper portion of the P-type body region 332 between the N-type source region 322 and the first channel region 341.

A trench insulation field plate 350 may be disposed in an upper portion of the N-type drift region 334 between the channel region 340 and the N-type drain region 324. The trench insulation field plate 350 may include the same material as a shallow trench isolation layer 352 disposed in the semiconductor layer 310 which separates a plurality of integrated devices from each other. The trench insulation field plate 350 and the shallow trench isolation layer 352 may be simultaneously formed. A top surface of the trench insulation field plate 350 may be coplanar with a top surface of the shallow trench isolation layer 352.

The trench insulation field plate 350 may have a thickness of about 3000 angstroms. A bottom surface of the trench insulation field plate 350 may be spaced apart from a bottom surface of the N-type drift region 334 by a certain distance. That is, a bottom surface of the trench insulation field plate 350 may be covered with the N-type drift region 334. The trench insulation field plate 350 may correspond to an insulation layer, for example, an oxide layer filling a trench 355 that is provided in the N-type drift region 334 to have a certain depth when measured from a top surface of the N-type drift region 334.

The trench insulation field plate 350 may have a first sidewall 350S1 adjacent to the first channel region 341 and a second sidewall 350S2 adjacent to the N-type drain region 324. That is, the first sidewall 350S1 and the second sidewall 350S2 may be disposed between the first channel region 341 and the N-type drain region 324 and arranged in a channel length direction.

Either or both of the first and second sidewalls 350S1 and 350S2 of the trench insulation field plate 350 may have a sloped profile. Alternatively, either or both of the first and second sidewalls 350S1 and 350S2 of the trench insulation field plate 350 may have a vertical profile. The first sidewall 350S1 of the trench insulation field plate 350 may be spaced apart from a sidewall of the N-type drift region 334 adjacent to the first channel region 341. The second sidewall 350S2 of the trench insulation field plate 350 may be spaced apart from the N-type drain region 324.

Although not shown in the drawings, in some embodiments, the second sidewall 350S2 of the trench insulation field plate 350 may be in contact with the N-type drain region 324. The trench insulation field plate 350 may have a recessed region 354. The recessed region 354 may have a certain depth when measured from a top surface of the trench insulation field plate 350.

A metal field plate 360 may be disposed on the trench insulation field plate 350. The metal field plate 360 may fill the recessed region 354 and may extend upwardly to protrude higher than the top surface of the trench insulation field plate 350 by a certain height. That is, a lower portion of the metal field plate 360 may be inserted into the recessed region 354. In some embodiments, the metal field plate 360 may include a tungsten material.

A first gate insulation layer 382 and a first gate electrode 384 may be sequentially stacked on the channel region 340 to constitute a gate stack 386. In some embodiments, the first gate insulation layer 382 may include an oxide material and the first gate electrode 384 may include a polysilicon material. The gate stack 386 may extend onto the N-type drift region 334 along a channel length direction. First gate spacers 388 may be disposed on both sidewalls of the gate stack 386, respectively. The first gate spacer 388 adjacent to the N-type source region 322 may be disposed to vertically overlap with the N-type source extension region 322a.

A bottom surface and an outer sidewall of the first gate spacer 388 disposed on a sidewall of the gate stack 386 opposite to the N-type source region 322 may be in direct contact with a top surface of the trench insulation field plate 350 and a first sidewall of the metal field plate 360, respectively. The first gate spacer 388 contacting the first sidewall of the metal field plate 360 may electrically insulate the first gate electrode 384 from the metal field plate 360. A thickness of the first gate electrode 384 may be less than a height of a protrusion of the metal field plate 360 that protrudes from the top surface of the trench insulation field plate 350.

A conductive field plate 387 may be disposed on the trench insulation field plate 350 to be adjacent to a second sidewall of the metal field plate 360 opposite to the gate stack 386. The conductive field plate 387 may include a second gate insulation layer 383 and a second gate electrode 385 which are sequentially stacked. A thickness of the second gate electrode 385 may be substantially equal to a thickness of the first gate electrode 384. The conductive field plate 387 may be disposed on a top surface of the trench insulation field plate 350 between the metal field plate 360 and the N-type drain region 324. Second gate spacers 389 may be disposed on both sidewalls of the conductive field plate 387, respectively.

An outer sidewall of the second gate spacer 389 disposed on a sidewall of the conductive field plate 387 opposite to the N-type drain region 324 may contact the second sidewall of the metal field plate 360. Thus, the first and second sidewalls of the metal field plate 360 may contact one of the first gate spacers 388 and one of the second gate spacers 389, respectively. A top surface of the trench insulation field plate 350 between the second gate spacer 389 on a sidewall of the conductive field plate 387 opposite to the metal field plate 360 and the N-type drain region 324 may be exposed.

A first gate contact plug 371 may be disposed on the first gate electrode 384. A second gate contact plug 372 may be disposed on the second gate electrode 385. A source contact plug 373 may be disposed on the N-type source region 322 and the P-type contact region 326. A drain contact plug 374 may be disposed on the N-type drain region 324. Each of the first gate contact plug 371, the second gate contact plug 372, the source contact plug 373 and the drain contact plug 374 may include the same metal material as the metal field plate 360. Top surfaces of the first gate contact plug 371, the second gate contact plug 372, the source contact plug 373, the drain contact plug 374 and the metal field plate 360 may be coplanar with each other and may be located at substantially the same level which is indicated by a dotted line 375 in FIG. 3.

A first metal interconnection line 391 may be disposed on the top surfaces of the first gate contact plug 371, the second gate contact plug 372 and the metal field plate 360. A second metal interconnection line 392 may be disposed on a top surface of the source contact plug 373. A third metal interconnection line 393 may be disposed on a top surface of the drain contact plug 374.

A turn-on voltage or a turn-off voltage may be applied to the first gate electrode 384 through the first metal interconnection line 391. The turn-on voltage or the turn-off voltage may also be applied to the metal field plate 360 and the second gate electrode 385 through the first metal interconnection line 391. A ground voltage VSS may be applied to the N-type source region 322 and the P-type body region 332 through the second metal interconnection line 392. A drain voltage VDD may be applied to the N-type drain region 324 through the third metal interconnection line 393.

In the high voltage integrated device 300, the first gate spacers 388 may be disposed on both sidewalls of the gate stack 386, respectively, and the N-type source region 322 may be realized to have an LDD structure. That is, N-type impurities may be implanted into the P-type body region 332 using the gate stack 386 as an ion implantation mask to form the N-type source extension region 322a before the first gate spacers 388 are formed. N-type impurities may be implanted into the P-type body region 332 using the gate stack 386 and the first gate spacers 388 as ion implantation masks to form the N-type deep source region 322b after the first gate spacers 388 are formed. As a result, a sidewall junction of the N-type source extension region 322a may be aligned with a sidewall of the gate stack 386, and a sidewall junction of the N-type deep source region 322b may be aligned with an outer sidewall of the first gate spacer 388 overlapping with the N-type source extension region 322a.

One of the first gate spacers 388 may be formed between the metal field plate 360 and the first gate electrode 384, and one of the second gate spacers 389 may be formed between the metal field plate 360 and the second gate electrode 385. Thus, the first and second gate contact plugs 371 and 372 may be formed on the first and second gate electrodes 384 and 385, respectively. The first metal interconnection line 391 may be formed on the first and second gate contact plugs 371 and 372 and the metal field plate 360. Accordingly, the first and second gate electrodes 384 and 385 and the metal field plate 360 may be electrically connected to each other through the first metal interconnection line 391.

Figure 4:
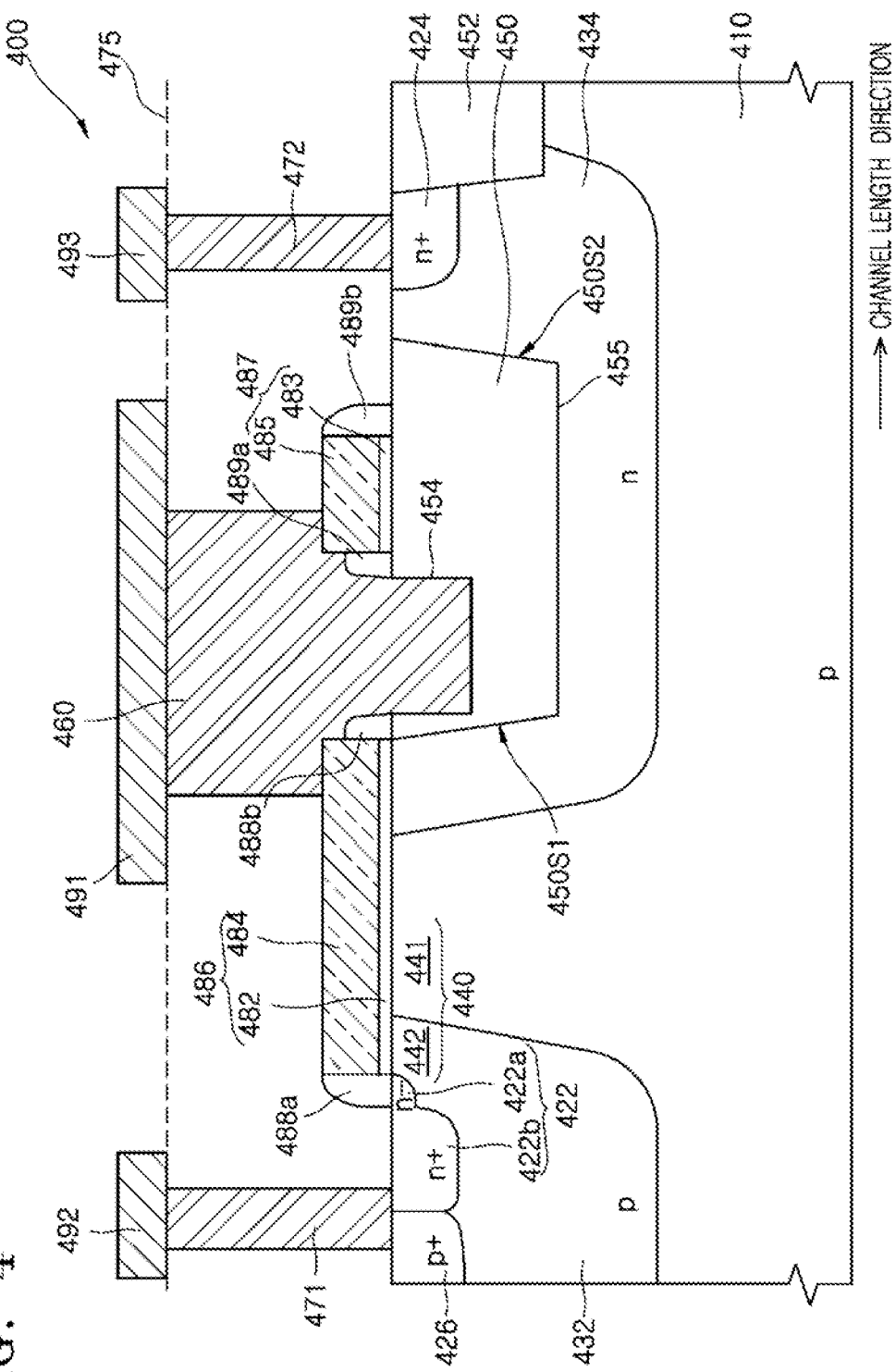
FIG. 4 is a cross-sectional view illustrating a high voltage integrated device having a trench insulation field plate, a single metal field plate, and a conductive field plate according to yet another embodiment.

FIG. 4 is a cross-sectional view illustrating a high voltage integrated device 400 having a trench insulation field plate, a single metal field plate and a conductive field plate according to yet another embodiment. Referring to FIG. 4, the high voltage integrated device 400 may include an N-type source region 422 and an N-type drain region 424 which are disposed in a semiconductor layer 410. The semiconductor layer 410 may be a semiconductor substrate having P-type conductivity. The semiconductor layer 410 may be an SOI substrate. In such a case, a semiconductor layer disposed on an insulator may have P-type conductivity. The semiconductor layer 410 may be an epitaxial layer having P-type conductivity.

Although not shown in the drawings, the semiconductor layer 410 may be disposed on a substrate. In such a case, an N-type buried layer heavily doped with N-type impurities may be disposed between the semiconductor layer 410 and the substrate. The N-type source region 422 may be surrounded by a P-type body region 432 disposed in the semiconductor layer 410.

The N-type source region 422 may have an LDD structure which is comprised of an N-type source extension region 422a lightly doped with N-type impurities and an N-type deep source region 422b heavily doped with N-type impurities. That is, an impurity concentration of the N-type source extension region 422a may be lower than an impurity concentration of the N-type deep source region 422b.

A P-type contact region 426 may be disposed in an upper portion of the P-type body region 432. A sidewall of the P-type contact region 426 may be in direct contact with a sidewall of the N-type source region 422. The N-type drain region 424 may be surrounded by an N-type drift region 434 disposed in the semiconductor layer 410.

A channel region 440 may be defined between the N-type source region 422 and the N-type drift region 434. The channel region 440 may include a first channel region 441 and a second channel region 442. The first channel region 441 may correspond to an upper portion of the semiconductor layer 410 between the P-type body region 432 and the N-type drift region 434. The second channel region 442 may correspond to an upper portion of the P-type body region 432 between the N-type source region 422 and the first channel region 441.

A trench insulation field plate 450 may be disposed in an upper portion of the N-type drift region 434 between the channel region 440 and the N-type drain region 424. The trench insulation field plate 450 may include the same material as a shallow trench isolation layer 452 disposed in the semiconductor layer 410 which separates a plurality of integrated devices from each other. The trench insulation field plate 450 and the shallow trench isolation layer 452 may be simultaneously formed. A top surface of the trench insulation field plate 450 may be coplanar with a top surface of the shallow trench isolation layer 452.

The trench insulation field plate 450 may have a thickness of about 3000 angstroms. A bottom surface of the trench insulation field plate 450 may be spaced apart from a bottom surface of the N-type drift region 434 by a certain distance. That is, a bottom surface of the trench insulation field plate 450 may be covered with the N-type drift region 434. The trench insulation field plate 450 may correspond to an insulation layer, for example, an oxide layer filling a trench 455 that is provided in the N-type drift region 434 to have a certain depth from a top surface of the N-type drift region 434.

The trench insulation field plate 450 may have a first sidewall 450S1 adjacent to the first channel region 441 and a second sidewall 450S2 adjacent to the N-type drain region 424. That is, the first sidewall 450S1 and the second sidewall 450S2 may be disposed between the first channel region 441 and the N-type drain region 424 and arranged along a channel length direction.

Either or both of the first and second sidewalls 450S1 and 450S2 of the trench insulation field plate 450 may have a sloped profile. Alternatively, either or both of the first and second sidewalls 450S1 and 450S2 of the trench insulation field plate 450 may have a vertical profile. The first sidewall 450S1 of the trench insulation field plate 450 may be spaced apart from a sidewall of the N-type drift region 434 adjacent to the first channel region 441. The second sidewall 450S2 of the trench insulation field plate 450 may be spaced apart from the N-type drain region 424.

Although not shown in the drawings, in some embodiments, the second sidewall 450S2 of the trench insulation field plate 450 may be in contact with the N-type drain region 424. The trench insulation field plate 450 may have a recessed region 454. The recessed region 454 may have a certain depth when measured from a top surface of the trench insulation field plate 450.

A metal field plate 460 may be disposed on the trench insulation field plate 450. The metal field plate 460 may fill the recessed region 454 and may extend upwardly to protrude higher than the top surface of the trench insulation field plate 450 by a certain height. A lower portion of the metal field plate 460 may be inserted into the recessed region 454. Thus, a bottom surface of the metal field plate 460 may be located at a level which is lower than a top surface of the semiconductor layer 410 or a top surface of the trench insulation field plate 450.

In some embodiments the metal field plate 460 may include a tungsten material. A first gate insulation layer 482 and a first gate electrode 484 may be sequentially stacked on the channel region 440 to constitute a gate stack 486. In some embodiments, the first gate insulation layer 482 may include an oxide material and the first gate electrode 484 may include a polysilicon material. The gate stack 486 may extend onto the N-type drift region 434 along a channel length direction. A thickness of the first gate electrode 484 may be less than a height of a protrusion of the metal field plate 460 that protrudes higher than the top surface of the trench insulation field plate 450.

A first source-side gate spacer 488a and a first drain-side gate spacer 488b may be disposed on both sidewalls of the gate stack 486, respectively. The first source-side gate spacer 488a may be disposed to vertically overlap with the N-type source extension region 422a. A bottom surface and an outer sidewall of the first drain-side gate spacer 488b may be in direct contact with a top surface of the trench insulation field plate 450 and a first sidewall of the metal field plate 460, respectively.

The first source-side gate spacer 488a and the first drain-side gate spacer 488b may be asymmetrical to each other with respect to a vertical line (not shown) passing through a central point of the gate stack 486. That is, while the first source-side gate spacer 488a is disposed to cover an entire surface of a left sidewall of the gate stack 486 adjacent to the N-type source region 422, the first drain-side gate spacer 488b may be disposed to cover a lower portion of a right sidewall of the gate stack 486 opposite to the first source-side gate spacer 488a. That is, an upper portion of the right sidewall of the gate stack 486 may be exposed by the first drain-side gate spacer 488b. Thus, a vertical thickness that is, a height of the first drain-side gate spacer 488b may be less than a vertical thickness of the first source-side gate spacer 488a.

A conductive field plate 487 may be disposed on the trench insulation field plate 450 adjacent to a second sidewall of the metal field plate 460 opposite to the gate stack 486. The conductive field plate 487 may include a second gate insulation layer 483 and a second gate electrode 485 which are sequentially stacked. A thickness of the second gate electrode 485 may be substantially equal to a thickness of the first gate electrode 484. The conductive field plate 487 may be disposed on a top surface of the trench insulation field plate 450 between the metal field plate 460 and the N-type drain region 424.

A second source-side gate spacer 489a and a second drain-side gate spacer 489b may be disposed on both sidewalls of the conductive field plate 487, respectively. An outer sidewall of the second source-side gate spacer 489a disposed on a sidewall of the conductive field plate 487 opposite to the N-type drain region 424 may contact the second sidewall of the metal field plate 460. An outer sidewall of the second drain-side gate spacer 489b disposed on a sidewall of the conductive field plate 487 opposite to the metal field plate 460 may be exposed. In addition, a top surface of the trench insulation field plate 450 between the second drain-side gate spacer 489b and the N-type drain region 424 may also be exposed.

The second source-side gate spacer 489a and the second drain-side gate spacer 489b may be asymmetrical to each other with respect to a vertical line (not shown) passing through a central point of the conductive field plate 487. That is, while the second drain-side gate spacer 489b is disposed to cover an entire surface of a right sidewall of the conductive field plate 487, the second source-side gate spacer 489a may be disposed to cover a lower portion of a left sidewall of the conductive field plate 487. That is an upper portion of the left sidewall of the conductive field plate 487 may be exposed by the second source-side gate spacer 489a. Thus, a vertical thickness that is, a height of the second source-side gate spacer 489a may be less than a vertical thickness of the second drain side gate spacer 489b.

The recessed region 454 provided in the trench insulation field plate 450 may be self-aligned with the first drain-side gate spacer 488b and the second source side gate spacer 489a. That is, a left sidewall of the recessed region 454 may be aligned with the first drain-side gate spacer 488b, and a right sidewall of the recessed region 454 may be aligned with the second source-side gate spacer 489a.

The metal field plate 460 may cover the first drain-side gate spacer 488b and the second source-side gate spacer 489a. The metal field plate 460 may be disposed to be in direct contact with a top surface of a right edge of the first gate electrode 484 and an upper portion of a right sidewall of the first gate electrode 484. The metal field plate 460 may also be in direct contact with a top surface of a left edge of the second gate electrode 485 and an upper portion of a left sidewall of the second gate electrode 485. Thus, the metal field plate 460 may be physically and electrically connected to the first and second gate electrodes 484 and 485.

A source contact plug 471 may be disposed on the N-type source region 422 and the P-type contact region 426. A drain contact plug 472 may be disposed on the N-type drain region 424. Each of the source contact plug 471 and the drain contact plug 472 may include the same metal material as the metal field plate 460. Top surfaces of the source contact plug 471, the drain contact plug 472, and the metal field plate 460 may be coplanar with each other and may be located at substantially the same level which is indicated by a dotted line 475 in FIG. 4.

A first metal interconnection line 491 may be disposed on a top surface of the metal field plate 460. A second metal interconnection line 492 may be disposed on a top surface of the source contact plug 471. A third metal interconnection line 493 may be disposed on a top surface of the drain contact plug 472.

A turn-on voltage or a turn-off voltage may be applied to the first gate electrode 484 through the first metal interconnection line 491. The turn-on voltage or the turn-off voltage may also be applied to the metal field plate 460 and the second gate electrode 485 through the first metal interconnection line 491. A ground voltage VSS may be applied to the N-type source region 422 and the P-type body region 432 through the second metal interconnection line 492. A drain voltage VDD may be applied to the N-type drain region 424 through the third metal interconnection line 493.

In the high voltage integrated device 400, the first source-side gate spacer 488a may be disposed on a left side rail of the gate stack 486, and the N-type source region 422 may be realized to have an LDD structure. That is, N-type impurities may be implanted into the P-type body region 432 using the gate stack 486 as an ion implantation mask to form the N-type source extension region 422a before the first gate spacers 488a and 488b are formed. N-type impurities may be implanted into the P-type body region 432 using the gate stack 486 and the first source-side gate spacer 488a as ion implantation masks to form the N-type deep source region 422b after the first gate spacers 488a and 488b are formed. As a result, a sidewall junction of the N-type source extension region 422a may be aligned with a sidewall of the gate stack 486, and a sidewall junction of the N-type deep source region 422b may be aligned with an outer sidewall of the first source-side gate spacer 488a overlapping with the N-type source extension region 422a.

Figure 5:
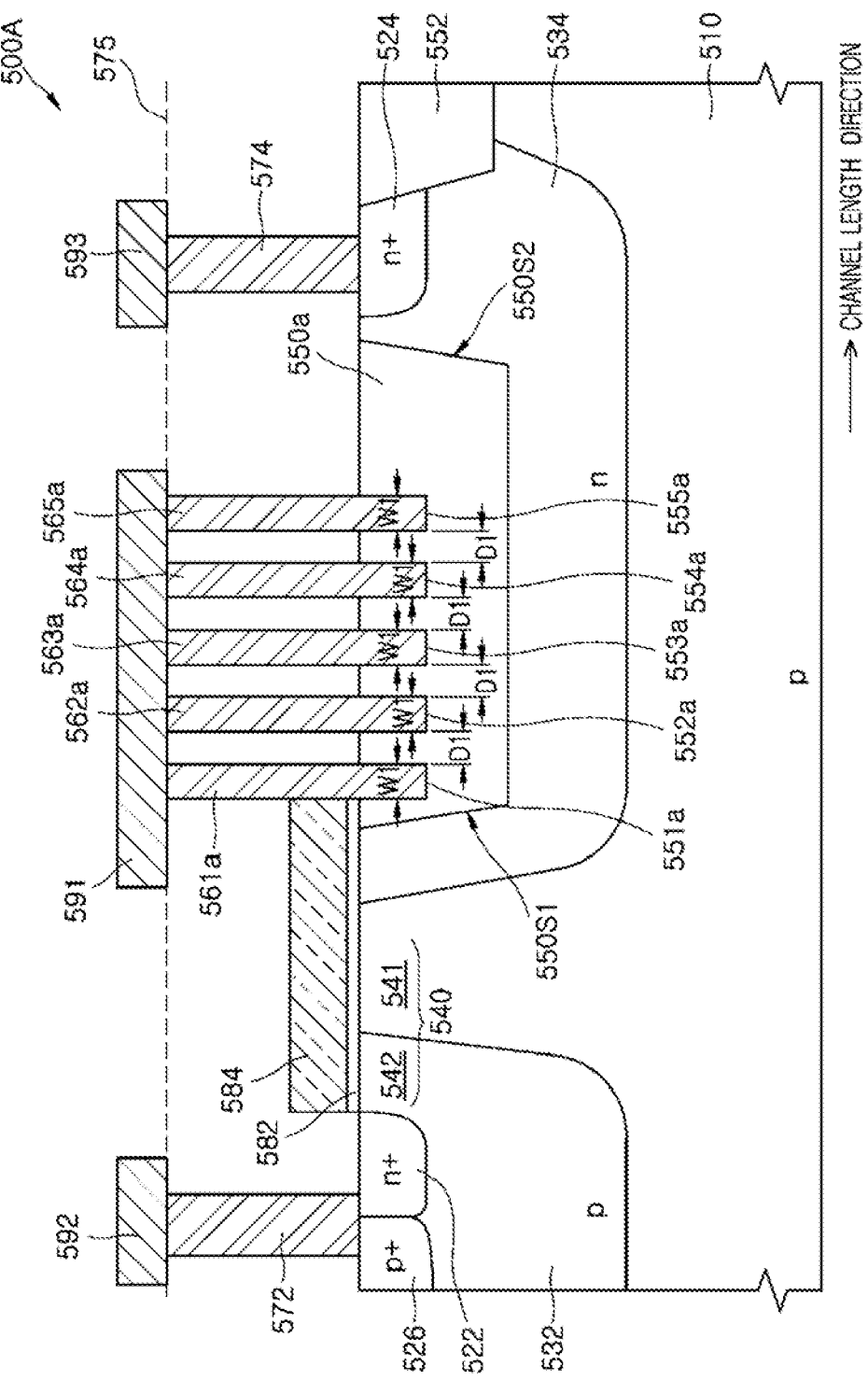
FIG. 5 is a cross-sectional view illustrating a high voltage integrated device having a trench insulation field plate and a plurality of metal field plates according to an embodiment.

FIG. 5 is a cross-sectional view illustrating a high voltage integrated device 500A having a trench insulation field plate and a plurality of metal field plates according to an embodiment. Referring to FIG. 5, the high voltage integrated device 500A may include an N-type source region 522 and an N-type drain region 524 which are disposed in a semiconductor layer 510.

The semiconductor layer 510 may be a semiconductor substrate having P-type conductivity. The semiconductor layer 510 may be a semiconductor-on-insulator (SOI) substrate. In such a case, a semiconductor layer disposed on an insulator may have P-type conductivity. The semiconductor layer 510 may be an epitaxial layer having P-type conductivity.

Although not shown in the drawings, the semiconductor layer 510 may be disposed on a substrate. In such a case, an N-type buried layer heavily doped with N-type impurities may be disposed between the semiconductor layer 510 and the substrate.

The N-type source region 522 may be surrounded by a P-type body region 532 disposed in the semiconductor layer 510. A P-type contact region 526 may be disposed in an upper portion of the P-type body region 532. A sidewall of the P-type contact region 526 may be in direct contact with a sidewall of the N-type source region 522. The N-type drain region 524 may be surrounded by an N-type drift region 534 disposed in the semiconductor layer 510.

A channel region 540 may be defined between the N-type source region 522 and the N-type drift region 534. The channel region 540 may include a first channel region 541 and a second channel region 542. The first channel region 541 may correspond to an upper portion of the semiconductor layer 510 between the P-type body region 532 and the N-type drift region 534. The second channel region 542 may correspond to an upper portion of the P-type body region 532 between the N-type source region 522 and the first channel region 541.

A trench insulation field plate 550a may be disposed in an upper portion of the N-type drift region 534 between the channel region 540 and the N-type drain region 524. The trench insulation field plate 550a may include the same material as a shallow trench isolation layer 552 disposed in the semiconductor layer 510 which separates a plurality of integrated devices from each other. The trench insulation field plate 550a and the shallow trench isolation layer 552 may be simultaneously formed. A top surface of the trench insulation field plate 550a may be coplanar with a top surface of the shallow trench isolation layer 552.

The trench insulation field plate 550a may have a thickness of about 3000 angstroms. A junction depth of the N-type drift region 534 may be greater than a thickness of the trench insulation field plate 550a. Thus, a bottom surface of the trench insulation field plate 550a may be spaced apart from a bottom surface of the N-type drift region 534 by a certain distance. That is, a bottom surface of the trench insulation field plate 550a may be covered with the N-type drift region 534.

The trench insulation field plate 550a may correspond to an insulation layer, for example, an oxide layer filling a trench that is provided in the N-type drift region 534 to have a certain depth when measured from a top surface of the N-type drift region 534. The trench insulation field plate 550a may have a first sidewall 550S1 adjacent to the first channel region 541 and a second sidewall 550S2 adjacent to the N-type drain region 524. The first sidewall 550S1 and the second sidewall 550S2 may be disposed between the first channel region 541 and the N-type drain region 524 and arranged in a channel length direction.

Either or both of the first and second sidewalls 550S1 and 550S2 of the trench insulation field plate 550a may have a sloped profile. Alternatively, either or both of the first and second sidewalls 550S1 and 550S2 of the trench insulation field plate 550a may have a vertical profile.

The first sidewall 550S1 of the trench insulation field plate 550a may be spaced apart from a sidewall of the N-type drift region 534 adjacent to the first channel region 541. The second sidewall 550S2 of the trench insulation field plate 550a may be spaced apart from the N-type drain region 524. Although not shown in the drawings, in some embodiments, the second sidewall 550S2 of the trench insulation field plate 550a may contact the N-type drain region 524.

The trench insulation field plate 550a may have a plurality of recessed regions 551a, 552a, 553a, 554a and 555a. FIG. 5 illustrates five recessed regions 551a, 552a, 553a, 554a and 555a. However, the present disclosure is not limited thereto. In some embodiments, the number of the recessed regions may be greater than or less than five. Each of the recessed regions 551a, 552a, 553a, 554a and 555a may have a certain depth when measured from a top surface of the trench insulation field plate 550a. The recessed regions 551a, 552a, 553a, 554a and 555a may have the same depth.

The recessed regions 551a, 552a, 553a, 554a and 555a may be spaced apart from each other by a distance D1. For example, the recessed regions 551a, 552a, 553a, 554a and 555a may be arranged in the channel length direction and may be spaced apart from each other by the distance D1. Each of the recessed regions 551a, 552a, 553a, 554a and 555a may have a width W1 when measured in the channel length direction. That is, the recessed regions 551a, 552a, 553a, 554a and 555a may have the same width.

First to fifth metal field plates 561a, 562a, 563a, 564a and 565a may be disposed on the trench insulation field plate 550a. The number of the metal field plates 561a, 562a, 563a, 564a and 565a may be equal to the number of the recessed regions 551a, 552a, 553a, 554a and 555a. The first to fifth metal field plates 561a, 562a, 563a, 564a and 565a may respectively fill the first to fifth recessed regions 551a, 552a, 553a, 554a and 555a and may extend upwardly to protrude higher than the top surface of the trench insulation field plate 550a by a certain height. Lower portions of the metal field plates 561a, 562a, 563a, 564a and 565a may be inserted into the recessed regions 551a, 552a, 553a, 554a and 555a, respectively.

The metal field plates 561a, 562a, 563a, 564a and 565a may be aligned with the recessed regions 551a, 552a, 553a, 554a and 555a, respectively. Thus, a distance between the metal field plates 561a, 562a, 563a, 564a and 565a may be substantially equal to the distance D1 between the recessed regions 551a, 552a, 553a, 554a and 555a. Moreover, a width of each of the metal field plates 561a, 562a, 563a, 564a and 565a which is measured in the channel length direction may also be substantially equal to the width W1 of each of the recessed regions 551a, 552a, 553a, 554a and 555a. In some embodiments, each of the metal field plates 561a, 562a, 563a, 564a and 565a may include a tungsten material.

A gate insulation layer 582 and a gate electrode 584 may be sequentially stacked on the channel region 540. In some embodiments, the gate insulation layer 582 may include an oxide material, and the gate electrode 584 may include a polysilicon material. The gate insulation layer 582 and the gate electrode 584 may extend onto the N-type drift region 534 and the trench insulation field plate 550a along the channel length direction.

Extensions of the gate insulation layer 582 and the gate electrode 584 may be in direct contact with a sidewall of the first metal field plate 561a which is closest to the channel region 540. Thus, the gate electrode 584 may be electrically and physically connected to the first metal field plate 561a. A thickness of the gate electrode 584 may be less than a height of protrusions of the metal field plates 561a~565a that protrude higher than the top surface of the trench insulation field plate 550a.

A source contact plug 572 may be disposed on the N-type source region 522 and the P-type contact region 526. A drain contact plug 574 may be disposed on the N-type drain region 524. Each of the source contact plug 572 and the drain contact plug 574 may include the same metal material as the metal field plates 561a~565a. Top surfaces of the source contact plug 572, the drain contact plug 574 and the metal field plates 561a~565a may be coplanar with each other and may be located at substantially the same level which is indicated by a dotted line 575 in FIG. 5.

A first metal interconnection line 591 may be disposed on top surfaces of the metal field plates 561a~565a. Thus, the metal field plates 561a~565a may be electrically connected to each other through the first metal interconnection line 591. A second metal interconnection line 592 may be disposed on a top surface of the source contact plug 572. A third metal interconnection line 593 may be disposed on a top surface of the drain contact plug 574.

A turn-on voltage or a turn-off voltage may be applied to the metal field plates 561a~565a and the gate electrode 584 through the first metal interconnection line 591. A ground voltage VSS may be applied to the N-type source region 522 and the P-type body region 532 through the second metal interconnection line 592. A drain voltage VDD may be applied to the N-type drain region 524 through the third metal interconnection line 593.

The high voltage integrated device 500A may have an improved breakdown voltage characteristic without degradation of an on-resistance characteristic. That is, as described with reference to FIG. 1, a depletion region may be formed in the N-type drift region 534 while the P-type body region 532 and the semiconductor layer 510 are grounded and the drain voltage VDD is applied to the N-type drain region 524. A depletion width in an upper portion of the N-type drift region 534 adjacent to the top surface of the N-type drift region 534 may increase due to the presence of the trench insulation field plate 550a. Accordingly, a junction breakdown voltage of the N-type drift region 534 and the N-type drain region 524 may be improved at the surface of the high voltage integrated device 500A.

In addition, a drift length of carriers in the N-type drift region 534 may increase due to the presence of the trench insulation field plate 550a. Thus, a peak electric field at an edge of the first channel region 541 contacting the N-type drift region 534 may be reduced and a drain junction breakdown voltage characteristic of the high voltage integrated device 500A may improve.

Even though a drift length of the carriers in the N-type drift region 534 increases due to the presence of the trench insulation field plate 550a, the turn-on voltage applied to the first metal field plate 561a may induce additional carrier accumulation that is, electrons in the N-type drift region 534 to compensate for degradation of an on-resistance characteristic of the high voltage integrated device 500A. Since the plurality of metal field plates, that is, the first to fifth metal field plates 561a~565a are arrayed to be uniformly spaced apart from each other along the channel length direction, equipotential lines distributed in the N-type drift region 534 under a bottom surface of the trench insulation field plate 550a may be almost flat due to the presence of the first to fifth metal field plates 561a~565a when a gate bias voltage is applied to the first metal interconnection line 591. A flatness of the equipotential lines distributed in the N-type drift region 534 may be controlled by changing a distance between the first to fifth metal field plates 561a~565a and a width of the first to fifth metal field plates 561a~565a.

Figure 6:
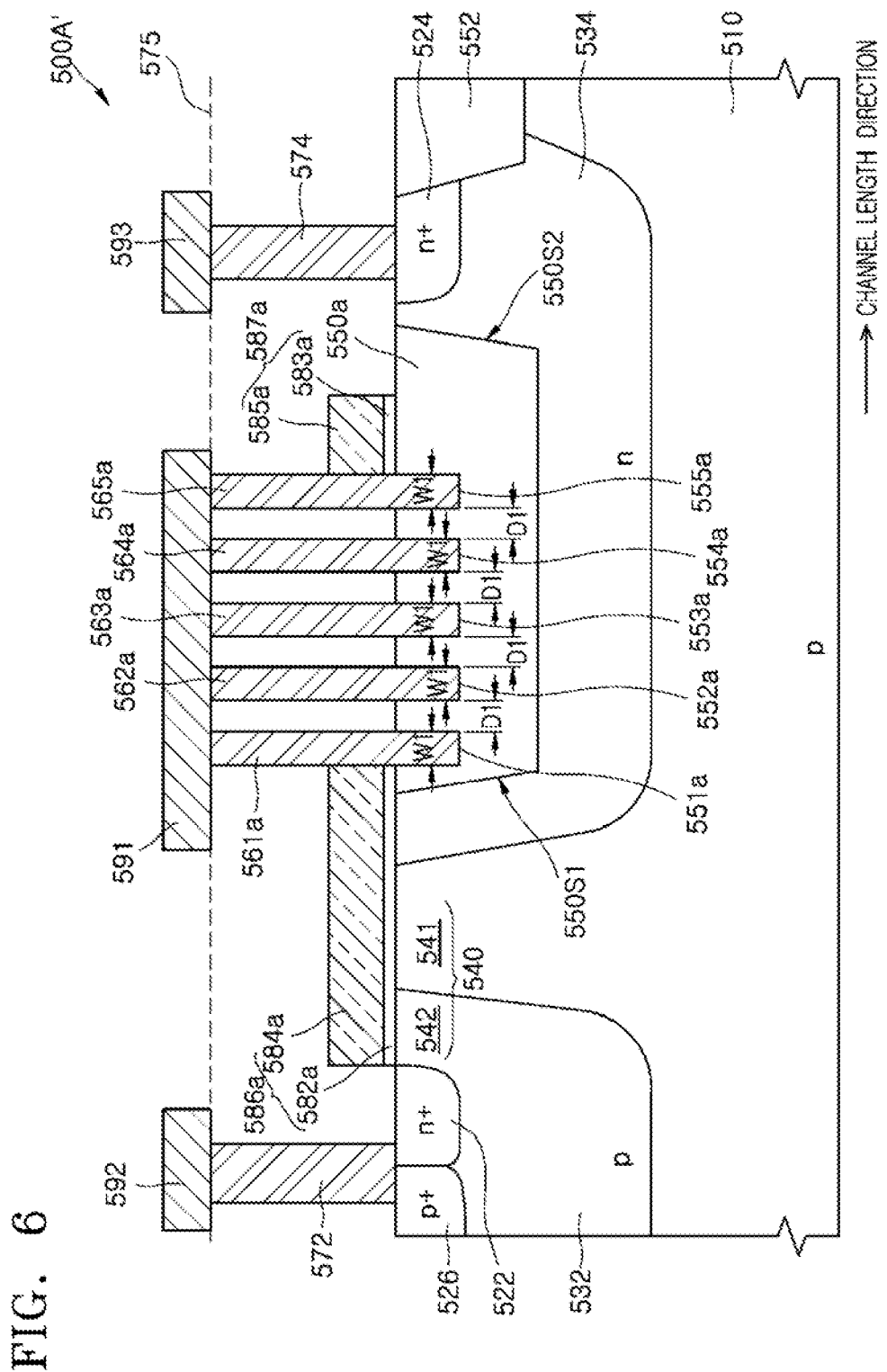
FIG. 6 is a cross-sectional view illustrating a high voltage integrated device having a trench insulation field plate, a plurality of metal field plates, and a conductive field plate according to an embodiment.

FIG. 6 is a cross-sectional view illustrating a high voltage integrated device 500A' having a trench insulation field plate, a plurality of metal field plates, and a conductive field plate according to an embodiment. In FIG. 6, the same reference numerals as used in FIG. 5 denote the same or the like elements. Thus, descriptions of the same elements as set forth with reference to FIG. 5 will be omitted or briefly mentioned hereinafter.

Referring to FIG. 6, the high voltage integrated device 500A' may have substantially the same configuration as the high voltage integrated device 500A shown in FIG. 5 except that the high voltage integrated device 500A' further includes an additional gate stack 587a corresponding to a second gate stack.

In FIG. 6, the reference numerals 582a and 584a indicate a first gate insulation layer corresponding to the gate insulation layer 582 of FIG. 5 and a first gate electrode corresponding to the gate electrode 584 of FIG. 5, respectively. The first gate insulation layer 582a and the first gate electrode 584a may constitute a first gate stack 586a.

The additional gate stack 587a, that is, the second gate stack may serve as a conductive field plate. The second gate stack 587a may include a second gate insulation layer 583a and a second gate electrode 585a which are sequentially stacked. A thickness of the second gate insulation layer 583a may be substantially equal to a thickness of the first gate insulation layer 582a, and the second gate insulation layer 583a may include the same material as the first gate insulation layer 582a.

In addition, a thickness of the second gate electrode 585a may be substantially equal to a thickness of the first gate electrode 584a, and the second gate electrode 585a may include the same material as the first gate electrode 584a. The second gate stack 587a may be disposed on the trench insulation field plate 550a between the fifth metal field plate 565a and the N-type drain region 524. A sidewall of the second gate stack 587a that is, the second gate electrode 585a may contact a sidewall of the fifth metal field plate 565a. Thus, the second gate electrode 585a may be physically and electrically connected to the fifth metal field plate 565a.

Figure 7:
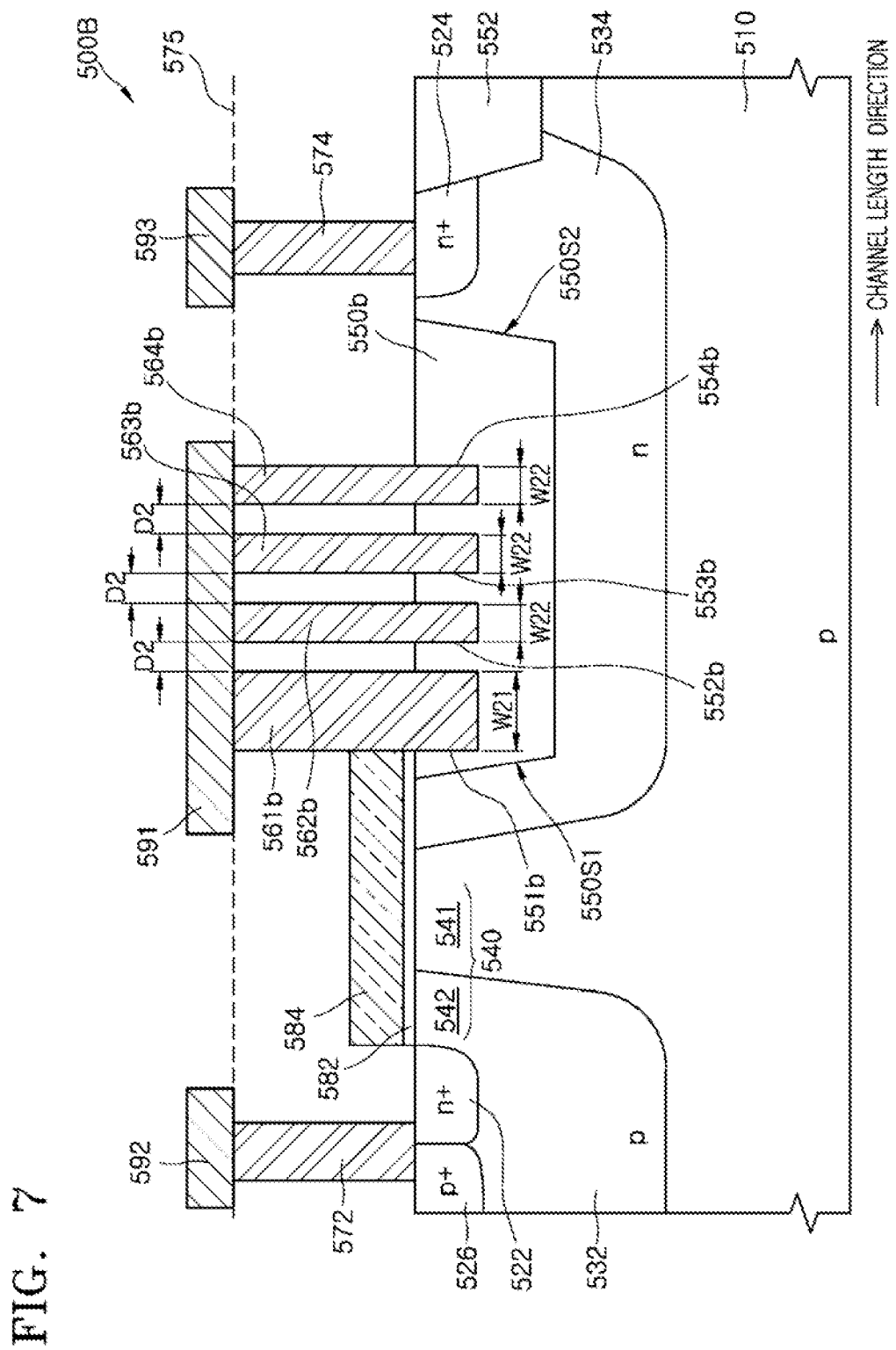
FIG. 7 is a cross-sectional view illustrating a high voltage integrated device having a trench insulation field plate and a plurality of metal field plates according to another embodiment.

FIG. 7 is a cross-sectional view illustrating a high voltage integrated device 500B having a trench insulation field plate and a plurality of metal field plates according to another embodiment. In FIG. 7, the same reference numerals as used in FIG. 5 denote the same or the like elements. Thus, descriptions of the same elements as set forth with reference to FIG. 5 will be omitted or briefly mentioned hereinafter.

Referring to FIG. 7, the high voltage integrated device 500B may include a trench insulation field plate 550b corresponding to the trench insulation field plate 550a of FIG. 5, and the trench insulation field plate 550b may have a plurality of recessed regions 551b, 552b, 553b and 554b. The plurality of recessed regions 551b, 552b, 553b and 554b may include first to fourth recessed regions 551b, 552b, 553b and 554b which are arranged in a channel length direction.

The first recessed region 551b may be adjacent to the channel region 540, and the fourth recessed region 554b may be adjacent to the N-type drain region 524. The first recessed region 551b may have a first width W21 in the channel length direction, and each of the second to fourth recessed regions 552b~554b may have a second width W22 in the channel length direction. The first width W21 may be greater than the second width W22. In some embodiments, the first width W21 may be 1.5 times to ten times the second width W22.

Although FIG. 7 illustrates an example in which the number of the recessed regions 552b~554b having the second width W22 is three, the present disclosure is not limited thereto. For example, in some embodiments, the number of the recessed regions having the second width W22 may be less than or greater than three. Each of the recessed regions 551b~554b may have a certain depth which is measured from a top surface of the trench insulation field plate 550b. The recessed regions 551b~554b may have substantially the same depth. The recessed regions 551b~554b may be spaced apart from each other by a distance D2.

First to fourth metal field plates 561b, 562b, 563b and 564b may be disposed on the trench insulation field plate 550b. The number of the metal field plates 561b~564b may be equal to the number of the recessed regions 551b~554b. The first to fourth metal field plates 561b~564b may respectively fill the first to fourth recessed regions 551b~554b and may extend upwardly to protrude higher than the top surface of the trench insulation field plate 550b by a certain height. Thus, bottom surfaces of the metal field plates 561b~564b may be located at a level which is lower than a top surface of the semiconductor layer 510 or the trench insulation field plate 550b.

The metal field plates 561b~564b may be aligned with the recessed regions 551b~554b, respectively. Thus a distance between the metal field plates 561b~564b may be substantially equal to the distance D2 between the recessed regions 551b~554b. In addition, the first metal field plate 561b may have the same width as the first width W21 in the channel length direction, and each of the second to fourth metal field plates 562b~564b may have the same width as the second width W22 in the channel length direction. A portion of a sidewall of the first metal field plate 561b may be in direct contact with a sidewall of the gate electrode 584. Thus, the first metal field plate 561b may be physically and electrically connected to the gate electrode 584. In some embodiments, each of the metal field plates 561b~564b may include a tungsten material.

Figure 8:
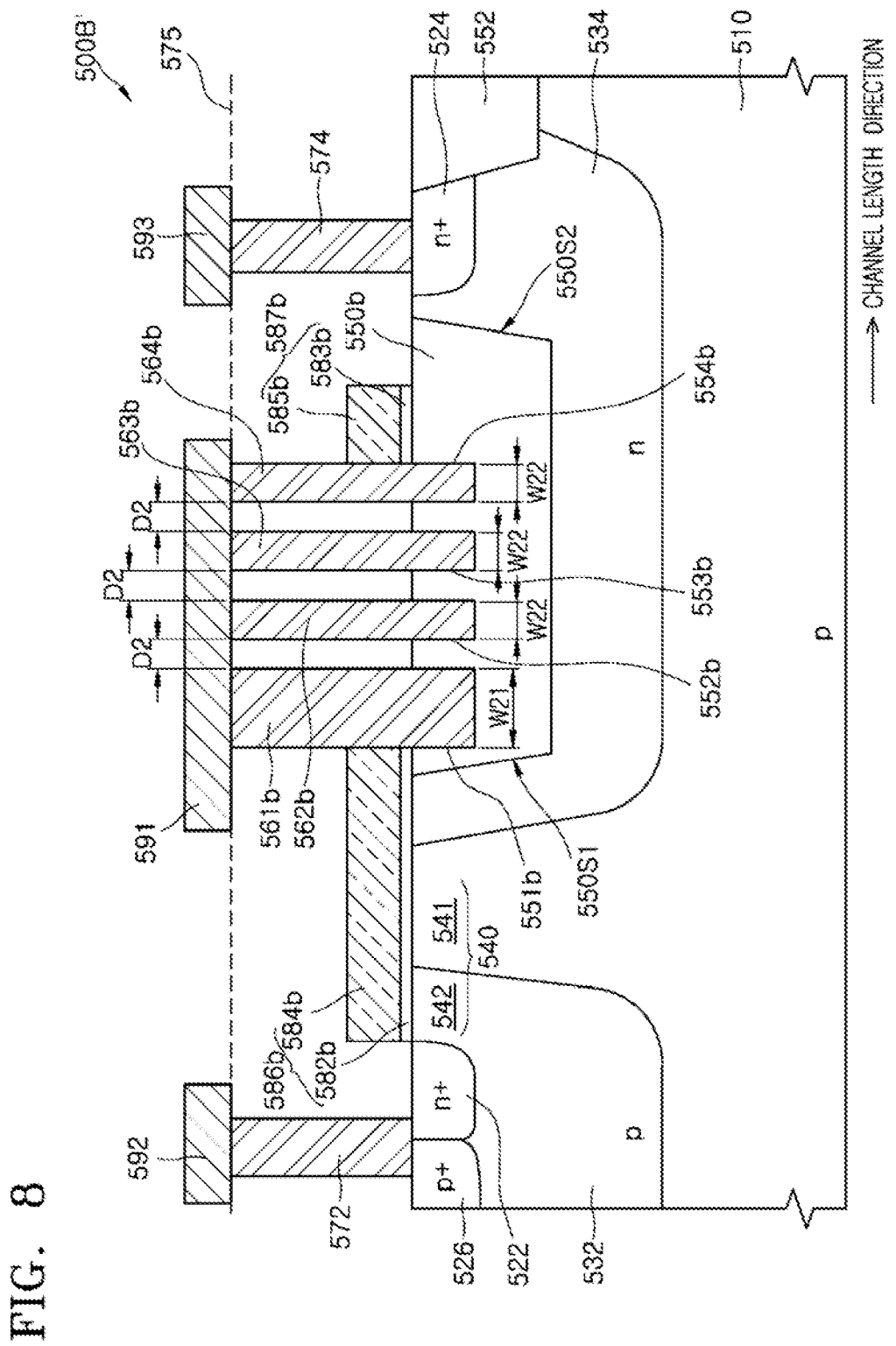
FIG. 8 is a cross-sectional view illustrating a high voltage integrated device having a trench insulation field plate, a plurality of metal field plates, and a conductive field plate according to another embodiment.

FIG. 8 is a cross-sectional view illustrating a high voltage integrated device 500B' having a trench insulation field plate, a plurality of metal field plates and a conductive field plate according to another embodiment. In FIG. 8, the same reference numerals as used in FIG. 7 denote the same elements. Thus, descriptions of the same elements as set forth with reference to FIG. 7 will be omitted or briefly mentioned hereinafter.

Referring to FIG. 8, the high voltage integrated device 500B' may have substantially the same configuration as the high voltage integrated device 500B shown in FIG. 7 except that the high voltage integrated device 500B' further includes an additional gate stack 587b corresponding to a second gate stack. In FIG. 8, the reference numerals 582b and 584b indicate a first gate insulation layer corresponding to the gate insulation layer 582 of FIG. 7 and a first gate electrode corresponding to the gate electrode 584 of FIG. 7, respectively. The first gate insulation layer 582b and the first gate electrode 584b may constitute a first gate stack 586b.

The additional gate stack 587b, that is the second gate stack may serve as a conductive field plate. The second gate stack 587b may include a second gate insulation layer 583b and a second gate electrode 585b which are sequentially stacked. A thickness of the second gate insulation layer 583b may be substantially equal to a thickness of the first gate insulation layer 582b, and the second gate insulation layer 583b may include the same material as the first gate insulation layer 582b. In addition, a thickness of the second gate electrode 585b may be substantially equal to a thickness of the first date electrode 584b, and the second gate electrode 585b may include the same material as the first gate electrode 584b.

The second gate stack 587b may be disposed on the trench insulation field plate 550b between the fourth metal field plate 564b and the N-type drain region 524. A sidewall of the second gate stack 587b that is, the second gate electrode 585b may contact a sidewall of the fourth metal field plate 564b. Thus, the second gate electrode 585b may be physically and electrically connected to the fourth metal field plate 564b.

Figure 9:
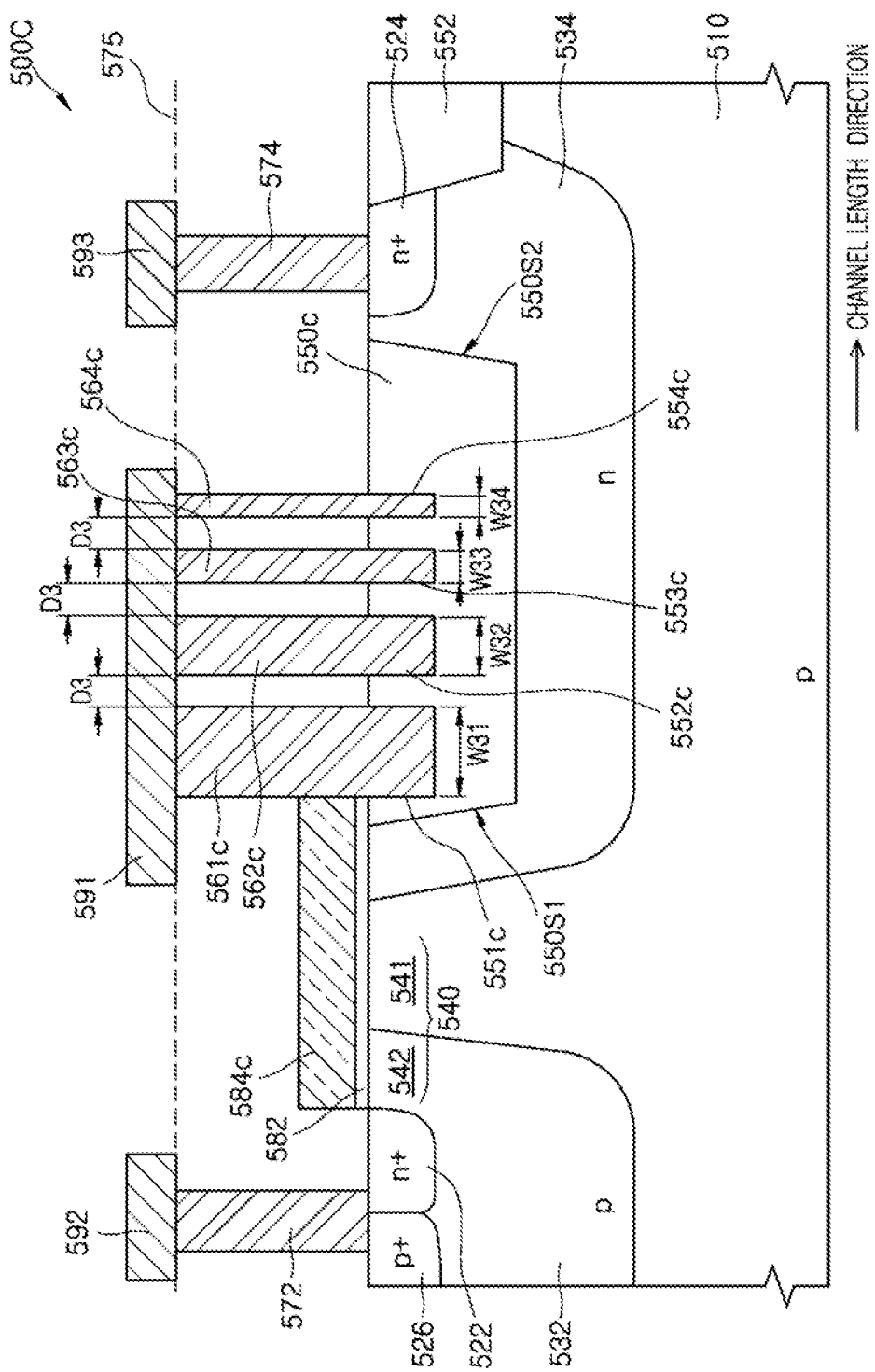
FIG. 9 is a cross-sectional view illustrating a high voltage integrated device having a trench insulation field plate and a plurality of metal field plates according to yet another embodiment.

FIG. 9 is a cross-sectional view illustrating a high voltage integrated device 500C having a trench insulation field plate and a plurality of metal field plates according to yet another embodiment. In FIG. 9, the same reference numerals as used in FIG. 5 denote the same elements. Thus, descriptions of the same elements as set forth with reference to FIG. 5 will be omitted or briefly mentioned hereinafter.

Referring to FIG. 9, the high voltage integrated device 500C may include a trench insulation field plate 550c corresponding to the trench insulation field plate 550a of FIG. 5, and the trench insulation field plate 550c may have a plurality of recessed regions 551c, 552c, 553c and 554c. The plurality of recessed regions 551c, 552c, 553c and 554c may include first to fourth recessed regions 551c, 552c, 553c and 554c which are arranged in a channel length direction. The first recessed region 551c may be adjacent to the channel region 540, and the fourth recessed region 554c may be adjacent to the N-type drain region 524.

The first to fourth recessed regions 551c~554c may have a first width W31, a second width W32, a third width W33 and a fourth width W34, which is measured in the channel length direction, respectively. A width of a recessed region disposed to be relatively close to the gate electrode 584 may be greater than a width of another recessed region disposed to be relatively far from the gate electrode 584. For example, the first width W31 of the first recessed region 551c, which is measured in the channel length direction, may be greater than the second width W32 of the second recessed region 552c, which is measured in the channel length direction. The second width W32 of the second recessed region 552c, which is measured in the channel length direction, may be greater than the third width W33 of the third recessed region 553c, which is measured in the channel length direction.

In addition, the third width W33 of the third recessed region 553c, which is measured in the channel length direction, may be greater than the fourth width W34 of the fourth recessed region 554c, which is measured in the channel length direction. Each of the recessed regions 551c~554c may have a certain depth when measured from a top surface of the trench insulation field plate 550c. The recessed regions 551c~554c may have substantially the same depth. The recessed regions 551b~554b may be spaced apart from each other by a distance D3.

First to fourth metal field plates 561c, 562c, 563c and 564c may be disposed on the trench insulation field plate 550c. The number of the metal field plates 561c~564c may be equal to the number of the recessed regions 551c~554c. The first to fourth metal field plates 561c~564c may respectively fill the first to fourth recessed regions 551c~554c and may extend upwardly to protrude higher than the top surface of the trench insulation field plate 550c by a certain height. Thus, bottom surfaces of the metal field plates 561c~564c may be located at a level which is lower than a top surface of the semiconductor layer 510 or the trench insulation field plate 550c.

The metal field plates 561c~564c may be aligned with the recessed regions 551c~554c, respectively. Thus, a distance between the metal field plates 561c~564c may be substantially equal to the distance D3 between the recessed regions 551c~554c. In addition, widths of the first to fourth metal field plates 561c~564c may be equal to the first to fourth widths W31, W32, W33 and W34 of the first to fourth recessed regions 551c~554c, respectively. That is, a width of one metal field plate disposed to be relatively close to the gate electrode 584 may be greater than a width of another metal field plate disposed to be relatively far from the gate electrode 584.

Accordingly, the first metal field plate 561c may have the first width W31, and the second metal field plate 562c may have the second width W32 which is less than the first width W31. Moreover, the third metal field plate 563c may have the third width W33 which is less than the second width W32, and the fourth metal field plate 564c may have the fourth width W34 which is less than the third width W33.

A portion of a sidewall of the first metal field plate 561c may be in direct contact with a sidewall of the gate electrode 584. Thus, the first metal field plate 561c may be physically and electrically connected to the gate electrode 584. In some embodiments, each of the metal field plates 561c~564c may include a tungsten material.

Figure 10:
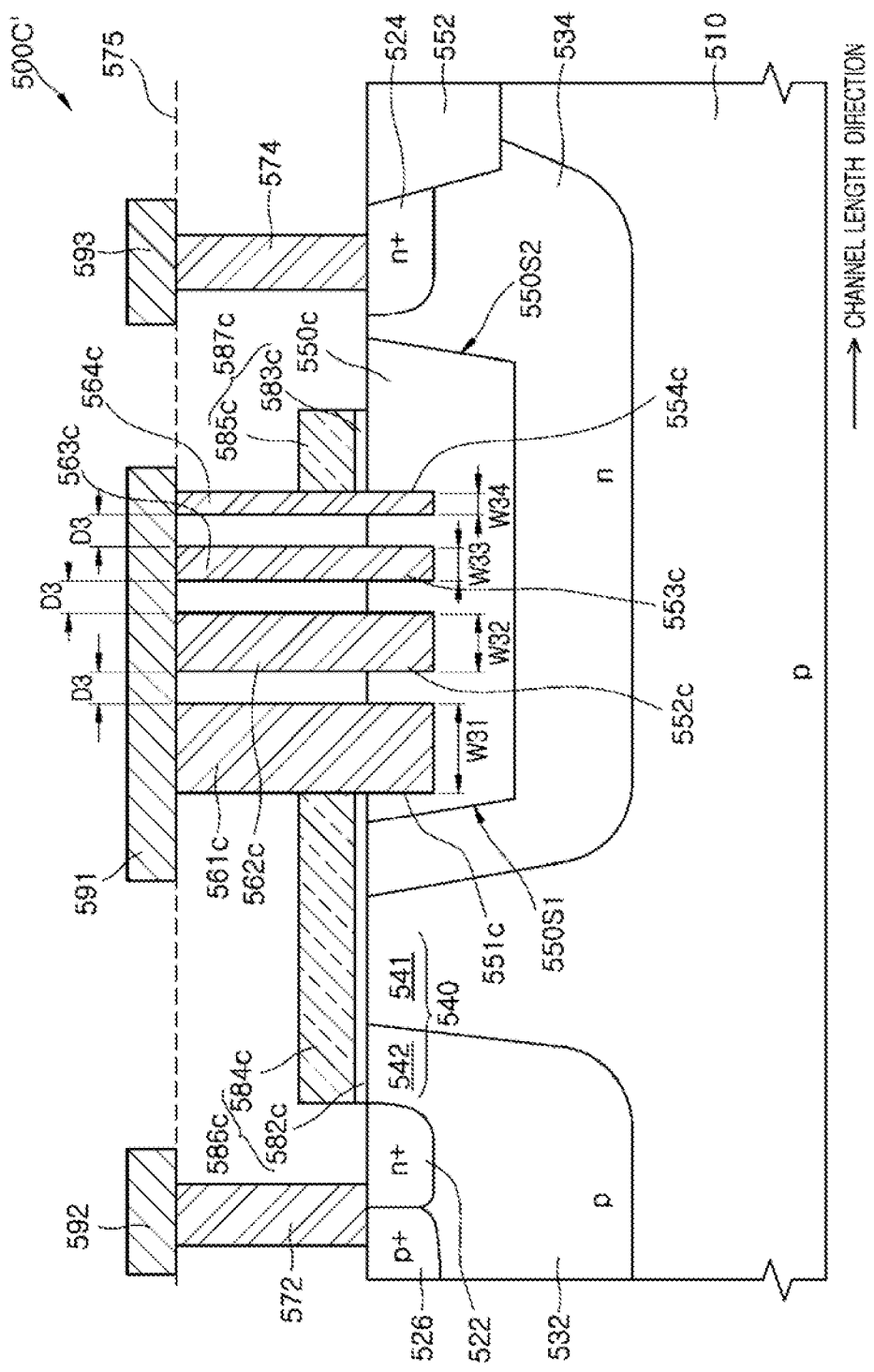
FIG. 10 is a cross-sectional view illustrating a high voltage integrated device having a trench insulation field plate, a plurality of metal field plates and a conductive field plate according to yet another embodiment.

FIG. 10 is a cross-sectional view illustrating a high voltage integrated device 500C' having a trench insulation field plate, a plurality of metal field plates and a conductive field plate according to yet another embodiment. In FIG. 10, the same reference numerals as used in FIG. 9 denote the same elements. Thus, descriptions of the same elements as set forth with reference to FIG. 9 will be omitted or briefly mentioned hereinafter. Referring to FIG. 10, the high voltage integrated device 500C' may have substantially the same configuration as the high voltage integrated device 500C shown in FIG. 9 except that the high voltage integrated device 500C' further includes an additional gate stack 587c corresponding to a second gate stack.

In FIG. 10, the reference numerals 582c and 584c indicate a first gate insulation layer corresponding to the gate insulation layer 582 of FIG. 9 and a first gate electrode corresponding to the gate electrode 584 of FIG. 9, respectively. The first gate insulation layer 582c and the first gate electrode 584c may constitute a first gate stack 586c. The additional gate stack 587c, that is, the second gate stack may serve as a conductive field plate.

The second gate stack 587c may include a second gate insulation layer 583c and a second gate electrode 585c which are sequentially stacked. A thickness of the second gate insulation layer 583c may be substantially equal to a thickness of the first gate insulation layer 582c, and the second gate insulation layer 583c may include the same material as the first gate insulation layer 582c.

In addition a thickness of the second gate electrode 585c may be substantially equal to a thickness of the first gate electrode 584c, and the second gate electrode 585c may include the same material as the first gate electrode 584c. The second gate stack 587c may be disposed on the trench insulation field plate 550c between the fourth metal field plate 564c and the N-type drain region 524. A sidewall of the second gate stack 587c that is the second gate electrode 585c may contact a sidewall of the fourth metal field plate 564c. Thus, the second gate electrode 585c may be physically and electrically connected to the fourth metal field plate 564c.

Figure 11:
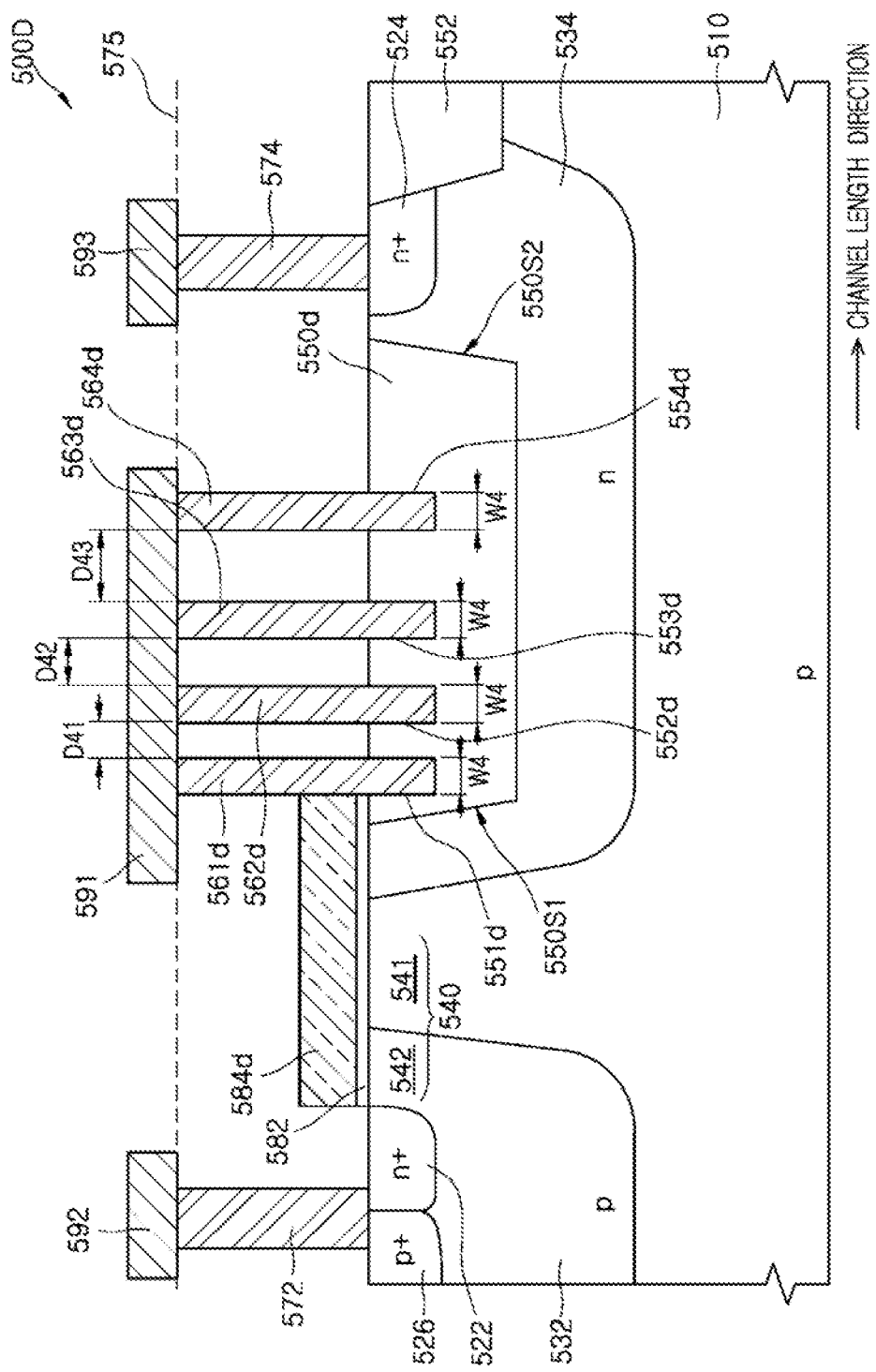
FIG. 11 is a cross-sectional view illustrating a high voltage integrated device having a trench insulation field plate and a plurality of metal field plates according to still another embodiment.

FIG. 11 is a cross-sectional view illustrating a high voltage integrated device 500D having a trench insulation field plate and a plurality of metal field plates according to still another embodiment. In FIG. 11, the same reference numerals as used in FIG. 5 denote the same elements. Thus descriptions of the same elements as set forth with reference to FIG. 5 will be omitted or briefly mentioned hereinafter.

Referring to FIG. 11, the high voltage integrated device 500D may include a trench insulation field plate 550d corresponding to the trench insulation field plate 550a of FIG. 5, and the trench insulation field plate 550d may have a plurality of recessed regions 551d, 552d, 553d and 554d. The plurality of recessed regions 551d, 552d, 553d and 554d may include first to fourth recessed regions 551d, 552d, 553d and 554d which are arranged in a channel length direction.

The first recessed region 551d may be adjacent to the channel region 540, and the fourth recessed region 554d may be adjacent to the N-type drain region 524. The first to fourth recessed regions 551d~554d may have the same width W4 in the channel length direction. Distances between the recessed regions 551d~554d may increase as the recessed regions 551d~554d are located farther away from the gate electrode 584.

That is, a first distance D41 between the first recessed region 551d and the second recessed region 552d may be less than a second distance D42 between the second recessed region 552d and the third recessed region 553d, and the second distance D42 between the second recessed region 552d and the third recessed region 553d may be less than a third distance D43 between the third recessed region 553d and the fourth recessed region 554d.

Although FIG. 11 illustrates example in which the number of the recessed regions 551d~554d is four, the present disclosure is not limited thereto. For example, in some embodiments, the number of the recessed regions may be less than or greater than four. Each of the recessed regions 551d~554d may have a certain depth from a top surface of the trench insulation field plate 550d. The recessed regions 551d~554d may have substantially the same depth.

First to fourth metal field plates 561d, 562d, 563d and 564d may be disposed on the trench insulation field plate 550d. The number of the metal field plates 561d~564d may be equal to the number of the recessed regions 551d~554d.

The first to fourth metal field plates 561d~564d may respectively fill the first to fourth recessed regions 551d~554d and may extend upwardly to protrude higher than the top surface of the trench insulation field plate 550d by a certain height. Thus, bottom surfaces of the metal field plates 561d~564d may be located at a level which is lower than a top surface of the semiconductor layer 510 or the trench insulation field plate 550d.

The metal field plates 561d~564d may be aligned with the recessed regions 551d~554d, respectively. Thus, widths of the metal field plates 561d~564d which are measured in the channel length direction may be equal to the width W4 of the recessed regions 551d~554d. In addition, distances between the metal field plates 561d~564d may increase as the metal field plates 561d~564d are located farther away from the gate electrode 584.

Accordingly, a distance between the first and second metal field plates 561d and 562d may be equal to the first distance D41, and a distance between the second and third metal field plates 562d and 563d may be equal to the second distance D42 which is greater than the first distance D41. In addition, a distance between the third and fourth metal field plates 563d and 564d may be equal to the third distance D43 which is greater than the second distance D42. A portion of a sidewall of the first metal field plate 561d may be in direct contact with a sidewall of the gate electrode 584. Thus, the first metal field plate 561d may be physically and electrically connected to the gate electrode 584. In some embodiments, each of the metal field plates 561d~564d may include a tungsten material.

Figure 12:
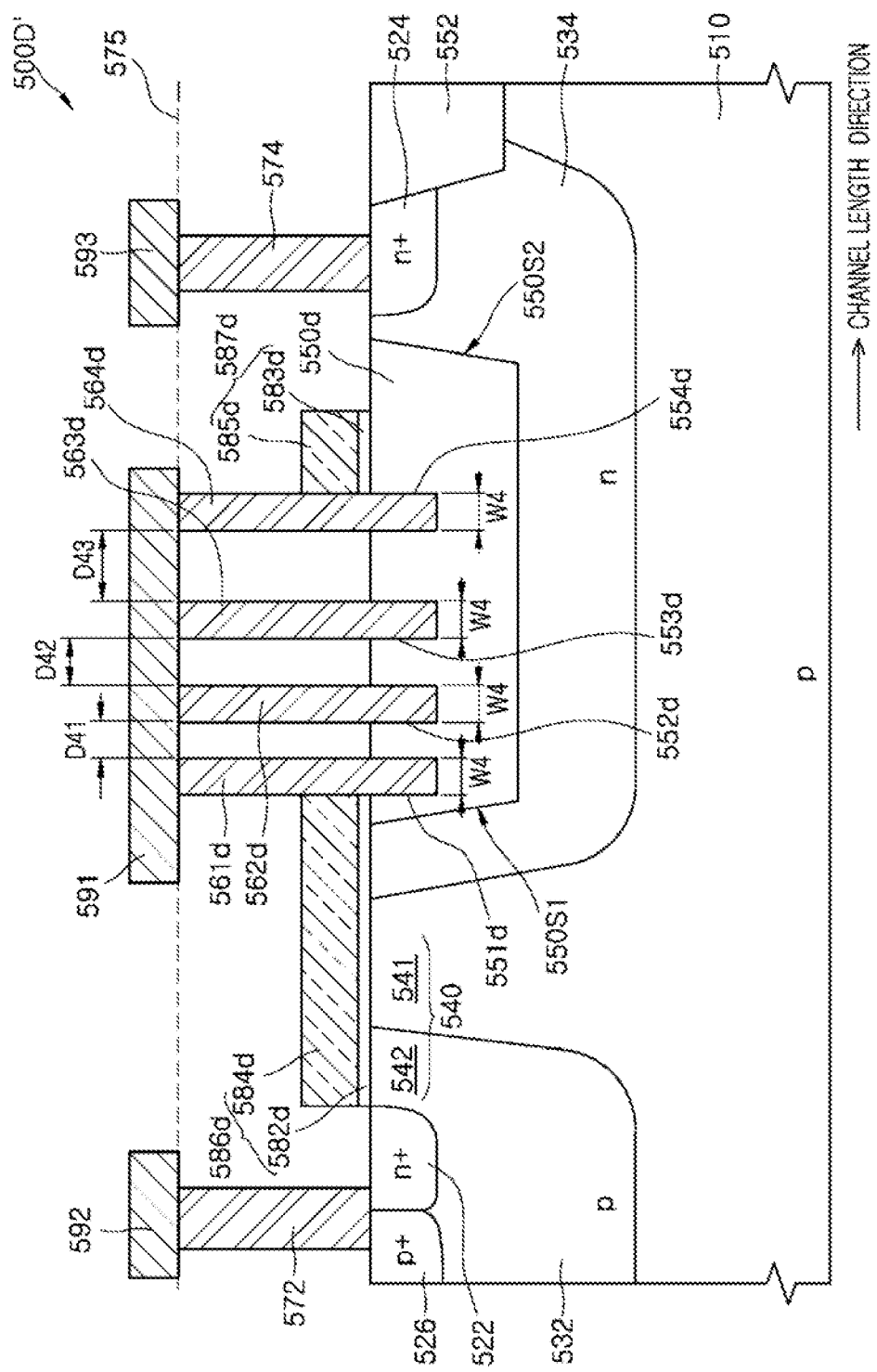
FIG. 12 is a cross-sectional view illustrating a high voltage integrated device having a trench insulation field plate, a plurality of metal field plates and a conductive field plate according to still another embodiment.

FIG. 12 is a cross-sectional view illustrating a high voltage integrated device 500D' having a trench insulation field plate, a plurality of metal field plates and a conductive field plate according to yet another embodiment. In FIG. 12, the same reference numerals as used in FIG. 11 denote the same elements. Thus, descriptions of the same elements as set forth with reference to FIG. 11 will be omitted or briefly mentioned hereinafter. Referring to FIG. 12, the high voltage integrated device 500D' may have substantially the same configuration as the high voltage integrated device 500D shown in FIG. 11 except that the high voltage integrated device 500D' further includes an additional gate stack 587d corresponding to a second gate stack.

In FIG. 12, the reference numerals 582d and 584d indicate a first gate insulation layer corresponding to the gate insulation layer 582 of FIG. 11 and a first gate electrode corresponding to the gate electrode 584 of FIG. 11, respectively. The first gate insulation layer 582d and the first gate electrode 584d may constitute a first gate stack 586d. The additional gate stack 587d, that is, the second gate stack may serve as a conductive field plate. The second gate stack 587d may include a second gate insulation layer 583d and a second gate electrode 585d which are sequentially stacked.

A thickness of the second gate insulation layer 583d may be substantially equal to a thickness of the first gate insulation layer 582d, and the second gate insulation layer 583d may include the same material as the first gate insulation layer 582d. In addition, a thickness of the second gate electrode 585d may be substantially equal to a thickness of the first gate electrode 584d, and the second gate electrode 585d may include the same material as the first gate electrode 584d.

The second gate stack 587d may be disposed on the trench insulation field plate 550d between the fourth metal field plate 564d and the N-type drain region 524. A sidewall of the second gate stack 587d such as, the second gate electrode 585d may be in contact with a sidewall of the fourth metal field plate 564d. Thus, the second gate electrode 585d may be physically and electrically connected to the fourth metal field plate 564d.

Figure 13:
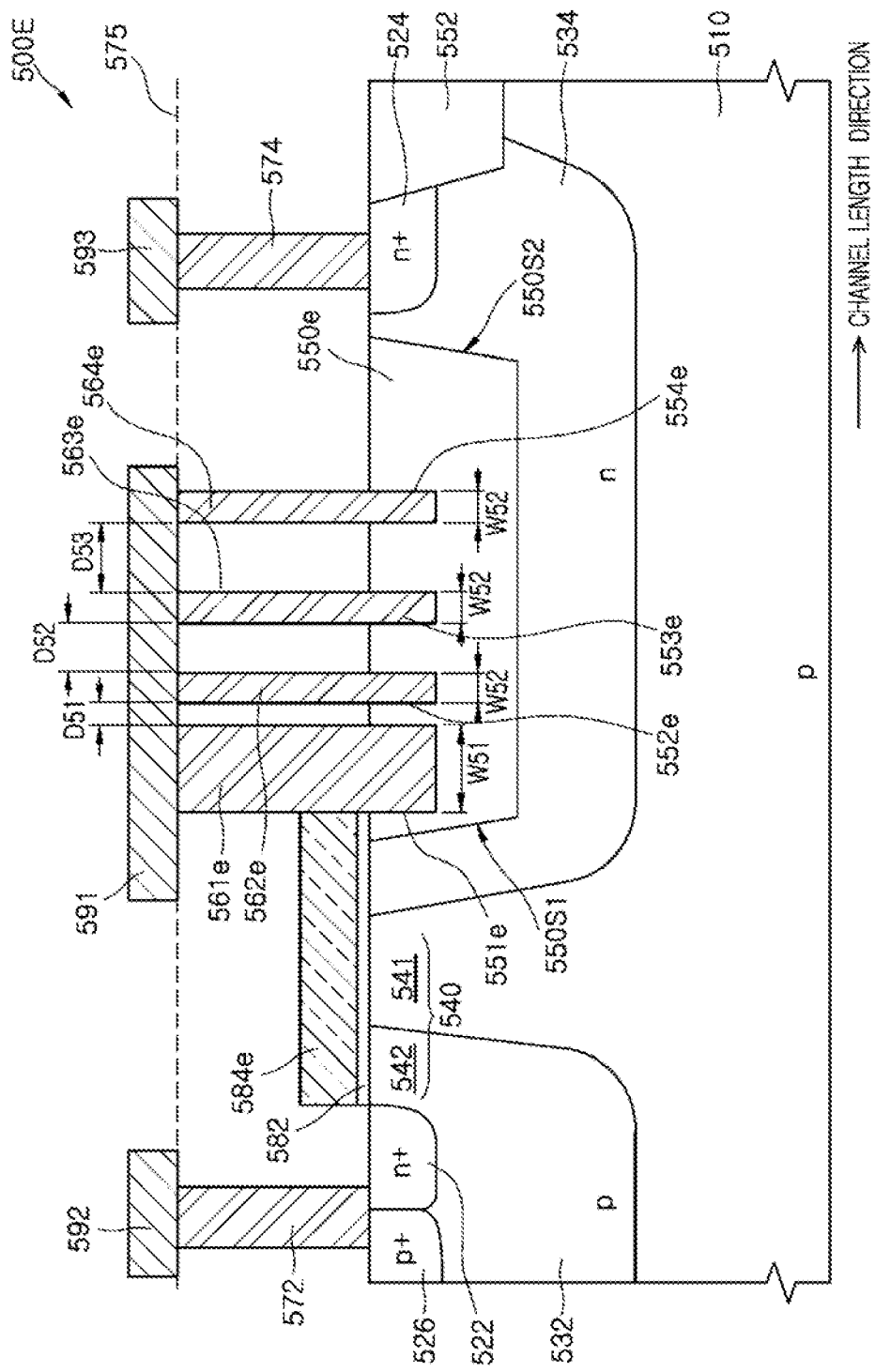
FIG. 13 is a cross-sectional view illustrating a high voltage integrated device having a trench insulation field plate and a plurality of metal field plates according to yet still another embodiment.

FIG. 13 is a cross-sectional view illustrating a high voltage integrated device 500E having a trench insulation field plate and a plurality of metal field plates according to yet still another embodiment. In FIG. 13, the same reference numerals as used in FIG. 5 denote the same elements. Thus, descriptions of the same elements as set forth with reference to FIG. 5 will be omitted or briefly mentioned hereinafter.

Referring to FIG. 13, the high voltage integrated device 500E may include a trench insulation field plate 550e corresponding to the trench insulation field plate 550a of FIG. 5, and the trench insulation field plate 550e may have a plurality of recessed regions 551e, 552e, 553e and 554e. The plurality of recessed regions 551e, 552e, 553e and 554e may include first to fourth recessed regions 551e, 552e, 553e and 554e which are arranged in a channel length directions.

The first recessed region 551e may be adjacent to the channel region 540, and the fourth recessed region 554e may be adjacent to the N-type drain region 524. The first recessed region 551e may have a first width W51, which is measured in the channel length direction, and each of the second to fourth recessed regions 552e~554e may have a second width W52, which is measured in the channel length direction. The first width W51 may be greater than the second width W52.

In some embodiments, the first width W51 may be 1.5 times to ten times the second width W52.

Although FIG. 13 illustrates an example in which the number of the recessed regions 552e~554e having the second width W52 is three, the present disclosure is not limited thereto. For example, in some embodiments, the number of the recessed regions having the second width W52 may be less than or greater than three.

Distances between the recessed regions 551e~554e may increase as the recessed regions 551e~554e are located farther away from the gate electrode 584. That is a first distance D51 between the first recessed region 551e and the second recessed region 552e may be less than a second distance D52 between the second recessed region 552e and the third recessed region 553e. The second distance D52 between the second recessed region 552e and the third recessed region 553e may be less than a third distance D53 between the third recessed region 553e and the fourth recessed region 554e. Each of the recessed regions 551e~554e may have a certain depth from a top surface of the trench insulation field plate 550e. The recessed regions 551e~554e may have substantially the same depth.

First to fourth metal field plates 561e, 562e, 563e and 564e may be disposed on the trench insulation field plate 550e. The number of the metal field plates 561e~564e may be equal to the number of the recessed regions 551e~554e. The first to fourth metal field plates 561e~564e may respectively fill the first to fourth recessed regions 551e~554e and may extend upwardly to protrude higher than the top surface of the trench insulation field plate 550e by a certain height. Thus, bottom surfaces of the metal field plates 561e~564e may be located at a level which is lower than a top surface of the semiconductor layer 510 or the trench insulation field plate 550e.

The metal field plates 561e~564e may be aligned with the recessed regions 551e~554e, respectively. Thus, the first metal field plate 561e may have the first width W51, and each of the second to fourth metal field plates 562e~564e may have the second width W52 which is less than the first width W51.

In addition, distances between the metal field plates 561e~564e may increase as the metal field plates 561e~564e are located farther away from the gate electrode 584. Accordingly, a distance between the first and second metal field plates 561e and 562e may be equal to the first distance D51, and a distance between the second and third metal field plates 562e and 563e may be equal to the second distance D52 which is greater than the first distance D51. In addition, a distance between the third and fourth metal field plates 563e and 564e may be equal to the third distance D53 which is greater than the second distance D52. A portion of a sidewall of the first metal field plate 561e may be in direct contact with a sidewall of the gate electrode 584. Thus, the first metal field plate 561e may be physically and electrically connected to the gate electrode 584. In some embodiments, each of the metal field plates 561e~564e may include a tungsten material.

Figure 14:
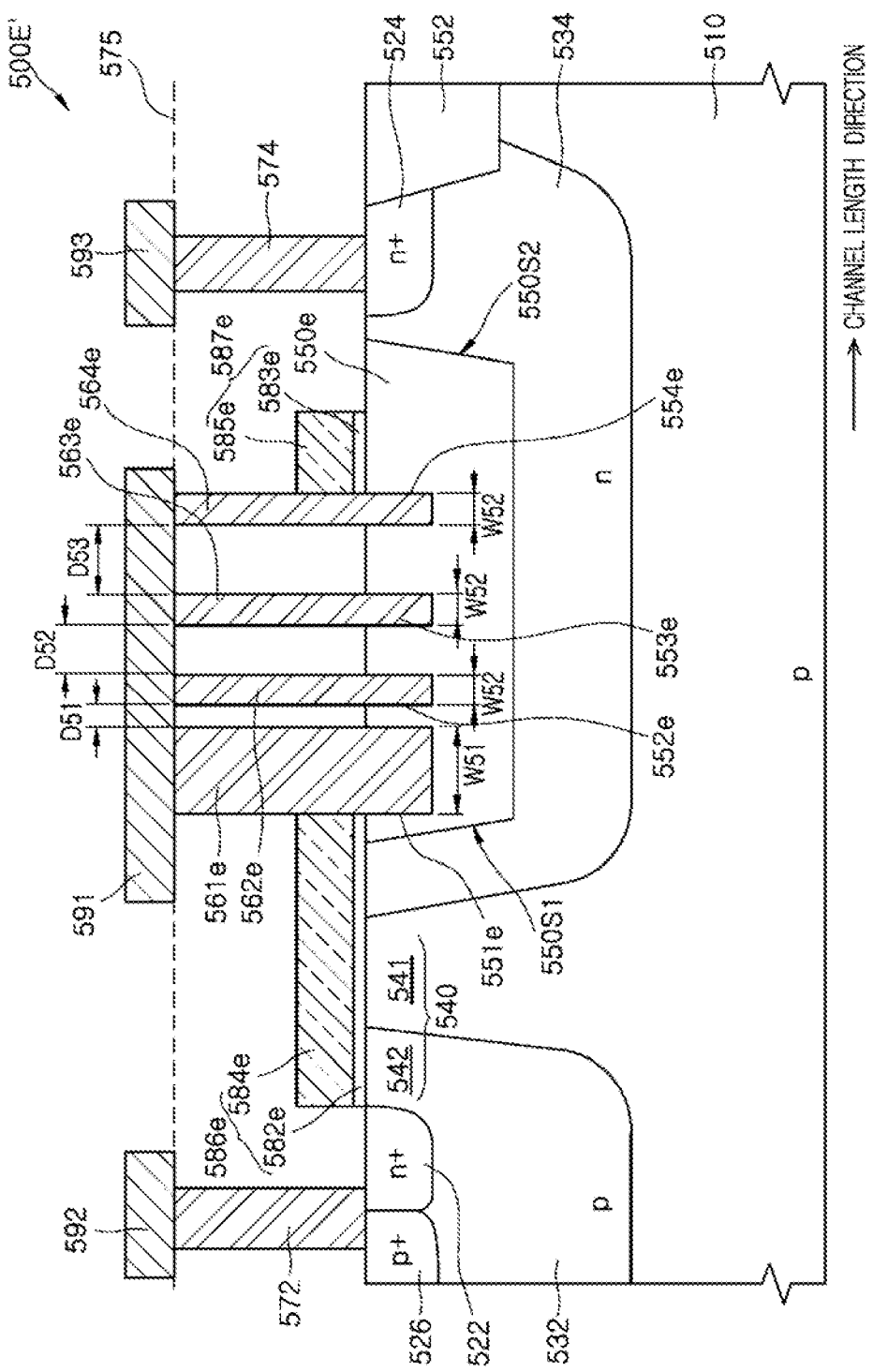
FIG. 14 is a cross-sectional view illustrating a high voltage integrated device having a trench insulation field plate, a plurality of metal field plates and a conductive field plate according to yet still another embodiment.

FIG. 14 is a cross-sectional view illustrating a high voltage integrated device 500E' having a trench insulation field plate, a plurality of metal field plates and a conductive field plate according to yet still another embodiment. In FIG. 14, the same reference numerals as used in FIG. 13 denote the same elements. Thus, descriptions of the same elements as set forth with reference to FIG. 13 will be omitted or briefly mentioned hereinafter. Referring to FIG. 14, the high voltage integrated device 500E' may have substantially the same configuration as the high voltage integrated device 500E shown in FIG. 13 except that the high voltage integrated device 500E' further includes an additional gate stack 587e corresponding to a second gate stack.

In FIG. 14, the reference numerals 582e and 584e indicate a first gate insulation layer corresponding to the gate insulation layer 582 of FIG. 13 and a first gate electrode corresponding to the gate electrode 584 of FIG. 13, respectively. The first gate insulation layer 582e and the first gate electrode 584e may constitute a first gate stack 586e.

The additional gate stack 587e, that is, the second gate stack may serve as a conductive field plate. The second gate stack 587e may include a second gate insulation layer 583e and a second gate electrode 585e which are sequentially stacked. A thickness of the second gate insulation layer 583e may be substantially equal to a thickness of the first gate insulation layer 582e, and the second gate insulation layer 583e may include the same material as the first gate insulation layer 582e.

In addition, a thickness of the second gate electrode 585e may be substantially equal to a thickness of the first gate electrode 584e, and the second gate electrode 585e may include the same material as the first gate electrode 584e. The second gate stack 587e may be disposed on the trench insulation field plate 550e between the fourth metal field plate 564e and the N-type drain region 524. A sidewall of the second gate stack 587e that is, the second gate electrode 585e may be in contact with a sidewall of the fourth metal field plate 564e. Thus, the second gate electrode 585e may be physically and electrically connected to the fourth metal field plate 564e.

Figure 15:
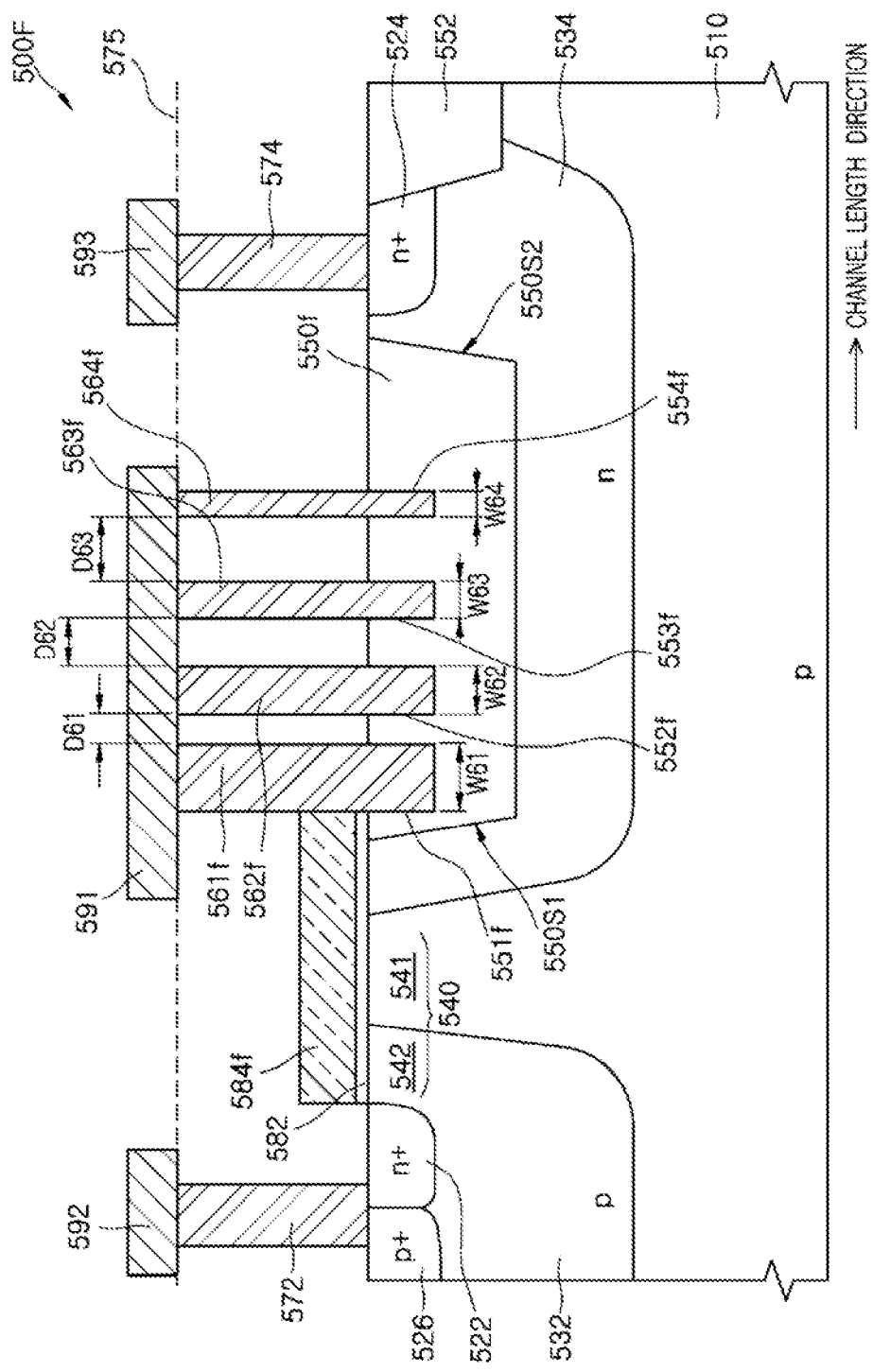
FIG. 15 is a cross-sectional view illustrating a high voltage integrated device having a trench insulation field plate and a plurality of metal field plates according to further another embodiment.

FIG. 15 is a cross-sectional view illustrating a high voltage integrated device 500F having a trench insulation field plate and a plurality of metal field plates according to further another embodiment. In FIG. 15, the same reference numerals as used in FIG. 5 denote the same elements. Thus, descriptions of the same elements as set forth with reference to FIG. 5 will be omitted or briefly mentioned hereinafter.

Referring to FIG. 15, the high voltage integrated device 500F may include a trench insulation field plate 550f corresponding to the trench insulation field plate 550a of FIG. 5, and the trench insulation field plate 550f may have a plurality of recessed regions 551f, 552f, 553f and 554f. The plurality of recessed regions 551e, 552e, 553e and 554e may include first to fourth recessed regions 551f, 552f, 553f and 554f which are arranged in a channel length direction.

The first recessed region 551f may be adjacent to the channel region 540, and the fourth recessed region 554f may be adjacent to the N-type drain region 524. The first to fourth recessed regions 551f, 552f, 553f and 554f may have first to fourth widths W61, W62, W63 and W64, which are measured in the channel length direction, respectively. A width of a recessed region disposed to be relatively close to the gate electrode 584 may be greater than a width of another recessed region disposed to be relatively far from the gate electrode 584.

That is, the first width W61 of the first recessed region 551f in the channel length direction may be greater than the second width W62 of the second recessed region 552f in the channel length direction, and the second width W62 of the second recessed region 552f in the channel length direction may be greater than the third width W63 of the third recessed region 553f in the channel length direction. In addition, the third width W63 of the third recessed region 553f in the channel length direction may be greater than the fourth width W64 of the fourth recessed region 554f in the channel length direction.

Distances between the recessed regions 551*f*~554*f* may increase as the recessed regions 551*f*~554*f* are located farther away from the gate electrode 584. That is, a first distance D61 between the first recessed region 551*f* and the second recessed region 552*f* may be less than a second distance D62 between the second recessed region 552*f* and the third recessed region 553*f*, and the second distance D62 between the second recessed region 552*f* and the third recessed region 553*f* may be less than a third distance D63 between the third recessed region 553*f* and the fourth recessed region 554*f*. Each of the recessed regions 551*f*~554*f* may have a certain depth when measured from a top surface of the trench insulation field plate 550*f*. The recessed regions 551*f*~554*f* may have substantially the same depth.

First to fourth metal field plates 561*f*, 562*f*, 563*f* and 564*f* may be disposed on the trench insulation field plate 550*f*. The number of the metal field plates 561*f*~564*f* may be equal to the number of the recessed regions 551*f*~554*f*. The first to fourth metal field plates 561*f*~564*f* may respectively fill the first to fourth recessed regions 551*f*~554*f* and may extend upwardly to protrude higher than the top surface of the trench insulation field plate 550*f* by a certain height. Thus, bottom surfaces of the metal field plates 561*f*~564*f* may be located at a level which is lower than a top surface of the semiconductor layer 510 or the trench insulation field plate 550*f*.

The first to fourth metal field plates 561*f*~564*f* may be aligned with the first to fourth recessed regions 551*f*~554*f*, respectively. Thus, a width of a metal field plate disposed to be relatively close to the gate electrode 584 may be greater than a width of another metal field plate disposed to be relatively far from the gate electrode 584. Accordingly, the first metal field plate 561*f* may have the first width W61, and the second metal field plate 562*f* may have the second width W62 which is less than the first width W61. Moreover, the third metal field plate 563*f* may have the third width W63 which is less than the second width W62, and the fourth metal field plate 564*f* may have the fourth width W64 which is less than the third width W63.

Distances between the metal field plates 561*f*~564*f* may increase as the metal field plates 561*f*~564*f* are located farther away from the gate electrode 584*f*. That is, a distance between the first and second metal field plates 561*f* and 562*f* may be equal to the first distance D61, and a distance between the second and third metal field plates 562*f* and 563*f* may be equal to the second distance D62 which is greater than the first distance D61. In addition, a distance between the third and fourth metal field plates 563*f* and 564*f* may be equal to the third distance D63 which is greater than the second distance D62.

A portion of a sidewall of the first metal field plate 561*f* may be in direct contact with a sidewall of the gate electrode 584.

Thus, the first metal field plate 561*f* may be physically and electrically connected to the gate electrode 584. In some embodiments, each of the metal field plates 561*f*~564*f* may include a tungsten material.

Figure 16:
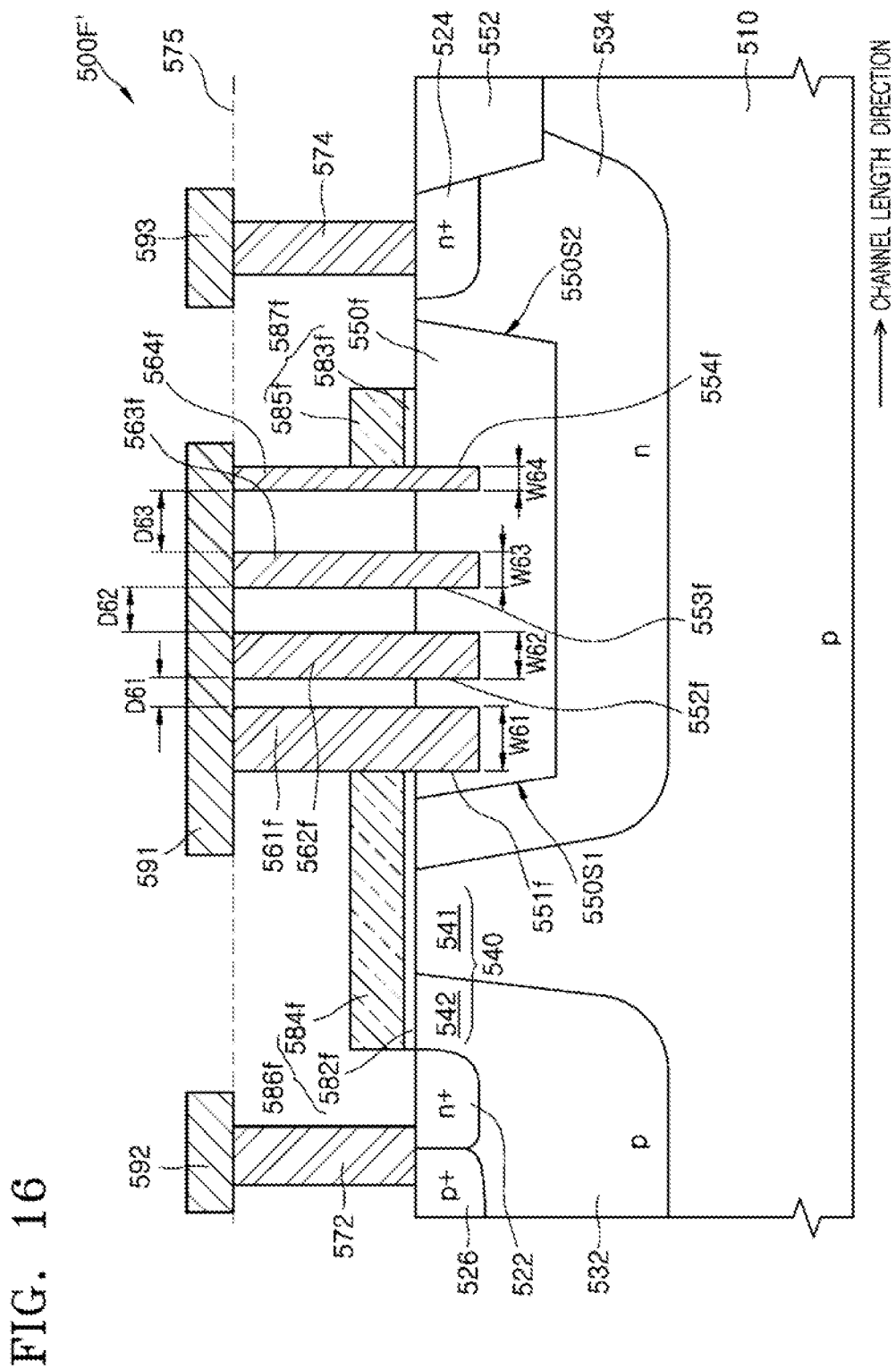
FIG. 16 is a cross-sectional view illustrating a high voltage integrated device having a trench insulation field plate, a plurality of metal field plates and a conductive field plate according to further another embodiment.

FIG. 16 is a cross-sectional view illustrating a high voltage integrated device 500F' having a trench insulation field plate, a plurality of metal field plates and a conductive field plate according to further another embodiment. In FIG. 16, the same reference numerals, as used in FIG. 15 denote the same elements. Thus, descriptions of the same elements as set forth with reference to FIG. 15 will be omitted or briefly mentioned hereinafter. Referring to FIG. 16, the high voltage integrated device 500F' may have substantially the same configuration as the high voltage integrated device 500F shown in FIG. 15 except that the high voltage integrated device 500F' further includes an additional gate stack 587*f* corresponding to a second gate stack.

In FIG. 16, the reference numerals 582*f* and 584*f* indicate a first gate insulation layer corresponding to the gate insulation layer 582 of FIG. 15 and a first gate electrode corresponding to the gate electrode 584 of FIG. 15, respectively. The first gate insulation layer 582*f* and the first gate electrode 584*f* may constitute a first gate stack 586*f*. The additional gate stack 587*f*, that is, the second gate stack may serve as a conductive field plate. The second gate stack 587*f* may include a second gate insulation layer 583*f* and a second gate electrode 585*f* which are sequentially stacked.

A thickness of the second gate insulation layer 583*f* may be substantially equal to a thickness of the first gate insulation layer 582*f*, and the second gate insulation layer 583*f* may include the same material as the first gate insulation layer 582*f*. In addition, a thickness of the second gate electrode 585*f* may be substantially equal to a thickness of the first gate electrode 584*f*, and the second gate electrode 585*f* may include the same material as the first gate electrode 584*f*.

The second gate stack 587*f* may be disposed on the trench insulation field plate 550*f* between the fourth metal field plate 564*f* and the N-type drain region 524. A sidewall of the second gate stack 587*f* that is, the second gate electrode 585*f* may be in contact with sidewall of the fourth metal field plate 564*f*. Thus, the second gate electrode 585*f* may be physically and electrically connected to the fourth metal field plate 564*f*.

Figure 17:
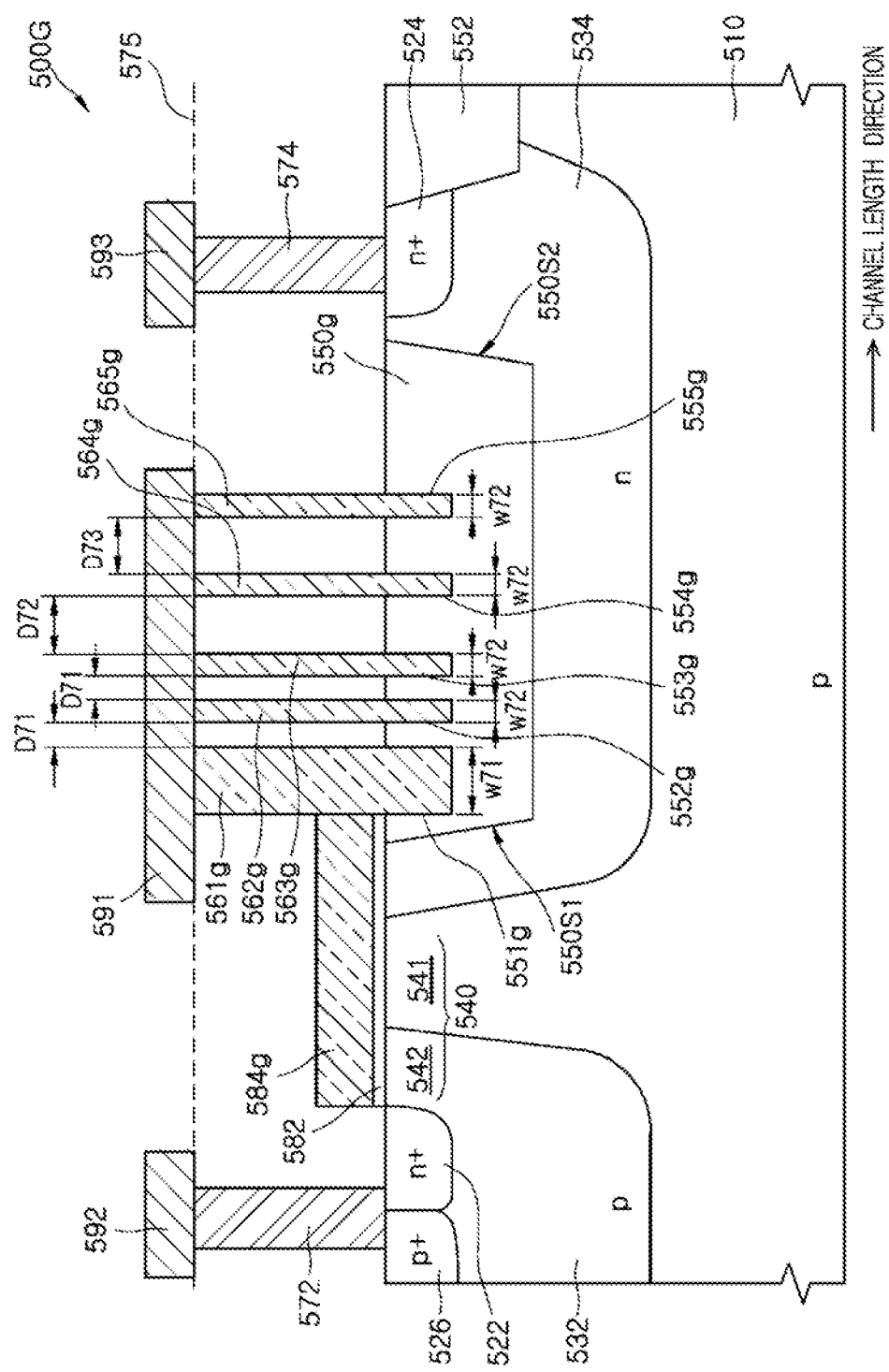
FIG. 17 is a cross-sectional view illustrating a high voltage integrated device having a trench insulation field plate and a plurality of metal field plates according to still further another embodiment and FIG. 18 is a cross-sectional view illustrating a high voltage integrated device having a trench insulation field plate, a plurality of metal field plates and a conductive field plate according to still further another embodiment.

FIG. 17 is a cross-sectional view illustrating a high voltage integrated device 500G having a trench insulation field plate and a plurality of metal field plates according to still further another embodiment. In FIG. 17, the same reference numerals as used in FIG. 5 denote the same elements. Thus, descriptions of the same elements as set forth with reference to FIG. 5 will be omitted or briefly mentioned hereinafter.

Referring to FIG. 17, the high voltage integrated device 500G may include a trench insulation field plate 550*g* corresponding to the trench insulation field plate 550*a* of FIG. 5, and the trench insulation field plate 550*g* may have a plurality of recessed regions 551*g*, 552*g*, 553*g*, 554*g* and 555*g*. The plurality of recessed regions 551*g*, 552*g*, 553*g*, 554*g* and 555*g* may include first to fifth recessed regions 551*g*, 552*g*, 553*g*, 554*g* and 555*g* which are arranged in a channel length direction. The first recessed region 551*g* may be disposed to be adjacent to the channel region 540, and the fifth recessed region 555*g* may be disposed to be adjacent to the N-type drain region 524.

The first recessed region 551*e* may have a first width W71, which is measured in the channel length direction, and each of the second to fifth recessed regions 552*g*~555*g* may have a second width W72, which is measured in the channel length directions. The first width W71 may be greater than the second width W72. In some embodiments, the first width W71 may be 1.5 times to ten times the second width W72.

The recessed regions 552*g*~555*g* may be spaced apart from each other along the channel length directions. Each of the distances between the recessed regions 552*g*~555*g* may be a first distance D71 or a second distance D72. Specifically, the first and second recessed regions 551*g* and 552*g* may be spaced apart from each other by a first distance D71, and the second and third recessed regions 552*g* and 553*g* may also be spaced apart from each other by the first distance D71. The third and fourth recessed regions 553*g* and 554g may be spaced apart from each other by a second distance D72, and the fourth and fifth recessed regions 554g and 555g may also be spaced apart from each other by the second distance D72. The second distance D72 may be greater than the first distance D71. Each of the recessed regions 551g~555g may have a certain depth when measured from a top surface of the trench insulation field plate 550g. The recessed regions 551g~555g may have substantially the same depth.

First to fifth metal field plates 561g, 562g, 563g, 564g and 565g may be disposed on the trench insulation field plate 550g. The number of the metal field plates 561g~565g may be equal to the number of the recessed regions 551g~555g. The first to fifth metal field plates 561g~565g may respectively fill the first to fifth recessed regions 551g~555g and may extend upwardly to protrude higher than the top surface of the trench insulation field plate 550g by a certain height. Bottom surfaces of the metal field plates 561g~565g may be located at a level which is lower than a top surface of the semiconductor layer 510 or the trench insulation field plate 550g.

The first to fifth metal field plates 561g~565g may be aligned with the first to fifth recessed regions 551g~555g, respectively. Thus, the first metal field plate 561g may have the first width W71, and each of the second to fifth metal field plates 562g~565g may have the second width W72 which is less than the first width W71.

In addition, distances between the metal field plates 561g~565g may be equal to the distances between the recessed regions 551g~555g, respectively. Specifically, the first and second metal field plates 561g and 562g may be spaced apart from each other by the first distance D71, and the second and third metal field plates 562g and 563g may also be spaced apart from each other by the first distance D71. In addition, the third and fourth metal field plates 563g and 564g may be spaced apart from each other by the second distance D72, and the fourth and fifth metal field plates 564g and 565g may also be spaced apart from each other by the second distance D72.

A portion of a sidewall of the first metal field plate 561g may be in direct contact with a sidewall of the gate electrode 584. Thus, the first metal field plate 561g may be physically and electrically connected to the gate electrode 584. In some embodiments, each of the metal field plates 561g~565g may include a tungsten material.

Figure 18:
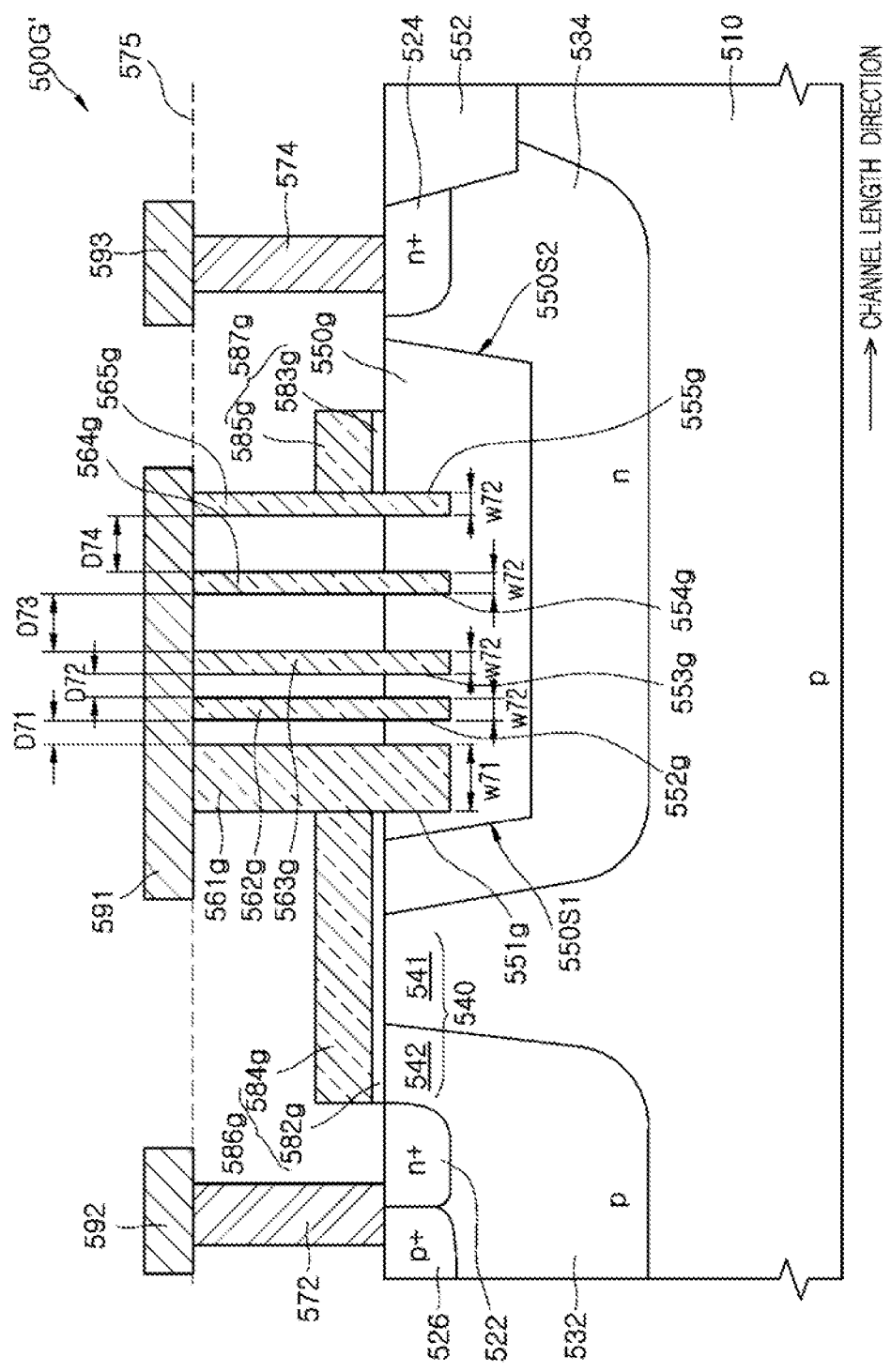

FIG. 18 is a cross-sectional view illustrating a high voltage integrated device 500G' having a trench insulation field plate, a plurality of metal field plates and a conductive field plate according to still further another embodiment. In FIG. 18, the same reference numerals as used in FIG. 17 denote the same elements. Thus, descriptions of the same elements as set forth with reference to FIG. 17 will be omitted or briefly mentioned hereinafter. Referring to FIG. 18, the high voltage integrated device 500G' may have substantially the same configuration as the high voltage integrated device 500G shown in FIG. 17 except that the high voltage integrated device 500G' further includes an additional gate stack 587g corresponding to a second gate stack.

In FIG. 18, the reference numerals 582g and 584g indicate a first gate insulation layer corresponding to the gate insulation layer 582 of FIG. 17 and a first gate electrode corresponding to the gate electrode 584 of FIG. 17, respectively. The first gate insulation layer 582g and the first gate electrode 584g may constitute a first gate stack 586g. The additional gate stack 587g, that is, the second gate stack may serve as a conductive field plate. The second gate stack 587g may include a second gate insulation layer 583g and a second gate electrode 585g which are sequentially stacked.

A thickness of the second gate insulation layer 583g may be substantially equal to a thickness of the first gate insulation layer 582g, and the second gate insulation layer 583g may include the same material as the first gate insulation layer 582g. In addition, a thickness of the second gate electrode 585g may be substantially equal to a thickness of the first gate electrode 584g, and the second gate electrode 585g may include the same material as the first gate electrode 584g.

The second gate stack 587g may be disposed on the trench insulation field plate 550g between the fifth metal field plate 565g and the N-type drain region 524. A sidewall of the second gate stack 587g, that is, the second gate electrode 585g may be in contact with a sidewall of the fifth metal field plate 565g. Thus, the second gate electrode 585g may be physically and electrically connected to the fourth metal field plate 565g.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A high voltage integrated device comprising:
   a source region and a drain region disposed in a semiconductor layer and spaced apart from each other;
   a drift region disposed in the semiconductor layer and surrounding the drain region;
   a channel region defined in the semiconductor layer and between the source region and the drift region, wherein the drift region is located between the channel region and the drain region;
   a trench insulation field plate disposed in the drift region, the trench insulation field plate having a recessed region to be recessed from the top surface of the drift region;
   a metal field plate disposed on and embedded in the trench insulation field plate, and filling the recessed region of the trench insulation field plate, wherein a top surface of the metal field plate is coplanar with a top surface of a source contact plug and a drain contact plug, and wherein a bottom surface of the metal field plate is spaced apart from the bottom surface of the trench insulation field plate and is spaced apart from the bottom surface of the drift region;
   a gate insulation layer provided over the channel region and extending over the drift region and over the trench insulation field plate; and
   a gate electrode disposed over the gate insulation layer, wherein a side surface of the gate insulation layer and a side surface of the gate electrode directly contact a side surface of the metal field plate.

2. The high voltage integrated device of claim 1,
   wherein the semiconductor layer has P-type conductivity; and
   wherein each of the source region, the drain region, and the drift region have N-type conductivity.

3. The high voltage integrated device of claim 1, further comprising:
   a body region disposed in the semiconductor layer and surrounding the source region,
   wherein the body region has an opposite conductivity to the source region.

4. The high voltage integrated device of claim 3,
wherein the channel region includes a first channel region and a second channel region,
wherein the first channel region is located in an upper portion of the semiconductor layer between the body region and the drift region, and
wherein the second channel region is located in an upper portion of the body region between the source region and the first channel region.

5. The high voltage integrated device of claim 1, wherein the trench insulation field plate is an insulation layer filling a trench that is provided in the drift region to have a certain depth from a top surface of the drift region.

6. The high voltage integrated device of claim 5, wherein the insulation layer is an oxide layer.

7. The high voltage integrated device of claim 5, wherein a top surface of the trench insulation field plate is coplanar with a top surface of the drift region.

8. The high voltage integrated device of claim 1, wherein the trench insulation field plate is disposed in an upper portion of the drift region and between the channel region and the drain region.

9. The high voltage integrated device of claim 8,
wherein the trench insulation field plate has a first sidewall and a second sidewall that are located opposite to each other, and
wherein the first sidewall of the trench insulation field plate is adjacent to the channel region and the second sidewall of the trench insulation field plate is adjacent to the drain region.

10. The high voltage integrated device of claim 1, wherein a sidewall of the recessed region is aligned with a sidewall of the gate insulation layer and further aligned with a sidewall of the gate electrode.

11. The high voltage integrated device of claim 1, wherein the metal field plate protrudes to a higher level than a top surface of the trench insulation field plate.

12. The high voltage integrated device of claim 11, wherein a top surface of the metal field plate is located at a higher level than a top surface of the gate electrode.

13. The high voltage integrated device of claim 1, wherein the metal field plate is electrically connected to the gate electrode.

14. The high voltage integrated device of claim 1, further comprising:
a source contact plug coupled to the source region; and
a drain contact plug coupled to the drain region.

15. The high voltage integrated device of claim 14, wherein a top surface of the metal field plate is located at substantially the same level as top surfaces of the source contact plug and the drain contact plug.

16. The high voltage integrated device of claim 15, wherein the metal field plate, the source contact plug, and the drain contact plug include the same metal material.

17. The high voltage integrated device of claim 16, wherein the same metal material includes tungsten.

18. The high voltage integrated device of claim 1, further comprising:
a conductive field plate disposed over a top surface of the trench insulation field plate.

19. The high voltage integrated device of claim 18, wherein the metal field plate is in direct contact with the gate electrode and the conductive field plate.

20. The high voltage integrated device of claim 18,
wherein the conductive field plate includes an insulation layer and a conductive layer which are vertically stacked,
wherein the insulation layer of the conductive field plate includes the same material as the gate insulation layer, and
wherein the conductive layer of the conductive field plate includes the same material as the gate electrode.

21. The high voltage integrated device of claim 18, wherein an edge of the trench insulation field plate adjacent to the drain region is uncovered by the conductive field plate.

* * * * *